US 6,556,074 B2

(12) United States Patent
Suzuki

(10) Patent No.: US 6,556,074 B2
(45) Date of Patent: Apr. 29, 2003

(54) DIFFERENTIAL AMPLIFYING CIRCUIT AND MULTI-STAGE DIFFERENTIAL AMPLIFYING CIRCUIT USING THE SAME

(75) Inventor: Yasufumi Suzuki, Tokyo (JP)

(73) Assignee: NEC Electronics Corporation, Kanagawa (JP)

( * ) Notice: Subject to any disclaimer, the term of this patent is extended or adjusted under 35 U.S.C. 154(b) by 0 days.

(21) Appl. No.: 10/127,877

(22) Filed: Apr. 23, 2002

(65) Prior Publication Data
US 2002/0158685 A1 Oct. 31, 2002

(30) Foreign Application Priority Data
Apr. 27, 2001 (JP) ........................ 2001-130730

(51) Int. Cl.[7] ............................... G06G 7/26
(52) U.S. Cl. ........................ 327/563; 327/52
(58) Field of Search .................. 327/563, 562, 327/434, 50, 52

(56) References Cited
U.S. PATENT DOCUMENTS
4,670,675 A * 6/1987 Donoghue ............. 365/185.21
5,708,391 A * 1/1998 Altmann et al. ............ 330/252
6,002,294 A * 12/1999 Kushibe ..................... 327/543
6,462,584 B1 * 10/2002 Proebsting .................. 327/52

* cited by examiner

Primary Examiner—Kenneth B. Wells
Assistant Examiner—Cassandra Cox
(74) Attorney, Agent, or Firm—Darryl G. Walker; Bradley T. Sako

(57) ABSTRACT

A multi-stage differential amplifying circuit (100) is disclosed. Multi-stage differential amplifying circuit (100) may include initial stage differential amplifying circuits (SN1 and SP1). Initial stage amplifying circuits (SN1 and SP1) may receive an input signal at input terminals (H01 and H02) and provide a differential output signal at nodes (N9 and N13). An amplitude controlling transistor (ND) may provide a controllable impedance path between nodes (N9 and N13). Amplitude controlling transistor (ND) may have a control gate connected to a current supply node (N10). The controllable impedance path may be controlled so that a magnitude of a differential output signal at nodes (N9 and N13) may be more consistent even when an offset voltage of an input signal at input terminals (H01 and H02) varies. A next stage differential amplifying circuit (SOP) may receive the differential output signal at nodes (N9 and N13) and provide an output signal at an output terminal (N01).

20 Claims, 13 Drawing Sheets

DIFFERENTIAL AMPLIFYING CIRCUIT AND MULTI-STAGE DIFFERENTIAL AMPLIFYING CIRCUIT USING THE SAME

TECHNICAL FIELD

The present invention relates generally to a differential amplifying circuit and more particularly to a differential amplifying circuit that may amplify a differential voltage applied to two input terminals and to a multi-stage differential amplifying circuit using the same.

BACKGROUND OF THE INVENTION

In order to operate a system at a higher speed, large scale integration (LSI) circuits are required to operate at higher frequencies. In order to achieve higher frequencies, signals are transmitted between integrated circuits using small amplitude differential signals. However, it is important to suppress delay differences in order to operate LSI circuits at high frequencies.

In order to achieve a high frequency operation, signal transmission/reception has the following requirements:

1. A transmission signal received external to a chip should have a small amplitude, but can have a wide input voltage range (offset). By allowing the small amplitude, a delay necessitated by charging or discharging a transmission line with respect to an output load can be reduced. Thus, data transfer can be reliably transmitted at high speeds. By allowing a wide range of input, operation can be satisfactory even if noise occurs on the transmission line.
2. Data inputs are synchronized with each other. By synchronizing data inputs, processing inside of the chip can be sped up.

Adverse affects of a difference in delay on a high frequency operation will now be explained with reference to FIGS. 9 and 10.

FIG. 9 sets forth a circuit schematic diagram of a conventional data receiver for a LSI circuit and given the general reference character 900.

Conventional data receiver 900 includes an input buffer block (A and B) and a flip-flop block F/F. Input buffer block A receives data inputs (D1P to D8P and D1N to D8N). Input buffer block B receives clock inputs (CLKP and CLKN). Input buffer block A provides data signals to flip-flop block F/F. The data signals provided by input buffer block A are latched in flip-flop block F/F in synchronism with a clock signal provided by input buffer block B. Input D is a data input into a flip-flop within flip-flop block F/F. Input CLK is a clock input into a flip-flop within flip-flop block F/F.

FIG. 10 is a timing diagram illustrating skews of input signals in conventional data receiver 900. FIG. 10 illustrates a data input signal DATA and a clock input signal CLKP. Data input signal DATA is representative of any data input signals (D1P to D8P and D1N to D8N).

As illustrated in FIG. 10, input buffer A has a delay difference SKEW-1 caused by variations of data input conditions (for example, amplitude and skew of a data input signal (D1P to D8P and D1N to D8N)). Input buffer B has a delay difference SKEW-2 caused by variations of clock input conditions (for example, amplitude and skew of a clock input signal (CLKN and CLKP)). Data input signal DATA has a setup time SETUP in which data input signal must be valid before clock input signal CLKP transitions high to ensure proper operation. Data input signal also has a hold time HOLD in which data input signal DATA must be held after clock input signal CLKP transitions high to ensure proper capture of the data value.

In view of the delay differences (SKEW-1 and SKEW-2) described above, the operation frequency (CLK frequency) of flip-flop block FIF can be expressed in the following equation:

$$CLK\ \text{frequency}=1/(SKEW\text{-}1+HOLD+SKEW\text{-}2+SETUP).$$

Assuming the operating frequency of flip-flop block F/F is 500 MHz and hold time HOLD and setup time SETUP are each 0.3 ns and that SKEW-1 equals SKEW-2, then SKEW-1 and SKEW-2=(2−0.3−0.3) ns/2=0.7 ns.

Thus, for proper operation of flip-flop block F/F, data input signals (D1P to D8P and D1N to D8N) and clock input signals (CLKP and CLKN) can only have 0.7 ns variations.

Also, in order to achieve a high frequency operation, low voltage differential signaling (LVDS) is used to transmit data from chip to chip. Thus, flip-flop block F/F must include buffers that can operate to receive signals having a small amplitude and within a wide input voltage range. LVDS uses differential data transmission by providing a forward and reverse signal transmitted at a small amplitude and within a wide input voltage range. In this way, a data interface at high speeds that is resistant to noise can be implemented.

Examples of a forward and reverse signal are illustrated in FIG. 11. FIG. 11 is a waveform diagram illustrating an example of a clock signal CLK and a data signal DATA. Data signal DATA includes a forward data signal DATAP and a reverse data signal DATAN. Likewise, clock signal CLK includes a forward clock signal CLKP and a reverse clock signal CLKN. Clock signal CLK and data signal DATA have an amplitude of about 100 mV and are input with a voltage offset within a range of 0 V to 2.2 V.

FIG. 12 is a circuit schematic diagram of a conventional input buffer given the general reference character 1200. Conventional input buffer 1200 is a multi-stage differential amplifying circuit and can operate to receive input signals having a small amplitude within a wide input voltage range.

Conventional input buffer 1200 includes initial stage differential amplifying circuits (SN1 and SP1), next stage differential amplifying circuit SOP, and a p-channel transistor P1. Conventional input buffer 1200 receives a small amplitude input signal at input terminals (H01 and H02) and provides an output at output terminal N01.

Initial stage differential amplifying circuit SN1 has p-channel transistors (P2 and P3) and n-channel transistors (N1 and N2). N-channel transistor N1 has a source connected to ground, a drain connected to node N13 and a gate connected to a drain of p-channel transistor P3 and a gate of n-channel transistor N2. P-channel transistor P2 has a source connected to a drain of p-channel transistor P1, a drain connected to node N13, and a gate connected to input terminal H02. P-channel transistor P3 has a source connected to a drain of p-channel transistor P1, a drain connected to a drain of n-channel transistor N2 and common gates of n-channel transistors (N1 and N2), and a gate connected to input terminal H01.

Initial stage differential amplifying circuit SP1 has p-channel transistors (P4 and P5) and n-channel transistors (N3 and N4). N-channel transistor N4 has a source connected to ground, a drain connected to node N9 and a gate connected to a drain of p-channel transistor P4 and a gate of n-channel transistor N3. P-channel transistor P5 has a source connected to a drain of p-channel transistor P1, a drain connected to node N9, and a gate connected to input terminal H01. P-channel transistor P4 has a source connected to a drain of p-channel transistor P1, a drain connected to a drain of n-channel transistor N3 and common gates of n-channel transistors (N3 and N4), and a gate connected to input terminal H02.

Next stage differential amplifying circuit SOP has p-channel transistors (P6, P7 and P8) and n-channel transistors (N5 and N6). N-channel transistor N6 has a source connected to ground, a drain connected to node NQ50 and a gate connected to a drain of p-channel transistor P8 and a gate of n-channel transistor N5. P-channel transistor P7 has a source connected to a drain of p-channel transistor P6, a drain connected to node NQ50, and a gate connected to node N9. P-channel transistor P8 has a source connected to a drain of p-channel transistor P6, a drain connected to a drain of n-channel transistor N5 and common gates of n-channel transistors (N5 and N6), and a gate connected to node N13. P-channel transistor P6 has a source connected to a power supply VDD and a gate connected to ground.

P-channel transistor P1 has a source connected to a power supply VDD and a gate connected to ground.

Inverter INV1 has an input connected to node NQ50 and an output connected to an input of inverter INV2. Inverter INV2 has an output connected to output terminal N01.

When a differential signal having a small amplitude is input into input terminals (H01 and H02), initial stage differential amplifying circuit SP1 amplifies a potential difference at input terminals (H01 and H02) and outputs a forward amplifying signal at node N9. In the meantime, initial stage differential amplifying circuit SN1 amplifies a potential difference at input terminals (H01 and H02) and outputs a reverse amplifying signal at node N13. Next stage amplifying circuit SOP receives the forward and reverse amplifying signals from nodes (N9 and N13), respectively, and provides further amplification to output an amplified signal to node NQ50. Inverters (INV1 and INV2) provide buffering for the signal at node NQ50 and output a signal which has a full VDD voltage swing at output terminal N01.

In this way, a signal having a small amplitude is amplified in two stages and conventional input buffer 1200 is a differential amplifying circuit which can be operated at a high speed in spite of the small amplitude signal received.

An illustration will now be made of delay differences in conventional input buffer 1200 (a conventional multi-stage differential amplifying circuit) by referring to waveforms from a SPICE (simulation program with an integrated circuit influence) simulation illustrated in FIG. 13.

FIG. 13 is a waveform diagram illustrating the operation of conventional input buffer 1200. The waveform diagram of FIG. 13 illustrates two sets of waveforms. The lower set of waveforms illustrates a case where an input signal at input terminals (H01 and H02) is a 100 mV signal with an offset of 0.0 V (input voltages are 0.0 V to 0.1 V). The upper set of waveforms illustrates a case where an input signal at input terminals (H01 and H02) is a 100 mV signal with an offset of 2.1 V (input voltages are 2.1 V to 2.2 V). All of the waveforms in the upper set have a DC offset of 4.0 V added in order to illustrate different simulation conditions on the same waveform diagram without unduly cluttering the figure. Thus, in the upper set of waveforms ground is at 4.0 V. In order to find the true voltage, 4.0 V must be subtracted from the illustrated voltage output.

Referring now to FIG. 13 in conjunction with FIG. 12, in the upper set of waveforms, when the input voltage is 2.1 V at input terminal H01 and 2.2 V at input terminal H02, the signal amplitude is amplified from 100 mV to 3,044 mV by initial stage differential amplifying circuits (SN1 and SP1), respectively. A delay time from an intersection between input signal at input terminals (H01 and H02) and a rising edge of a signal at node (N9 or N13) is defined as delay tpdr and is 3.044 ns. A delay time from an intersection between input signal at input terminals (H01 and H02) and a falling edge of a signal at node (N9 or N13) is defined as delay tpdf and is 3.453 ns. A delay time (delay tpdr) from an intersection between input signal at input terminals (H01 and H02) and a rising edge (VDD/2 point) of a signal at output terminal N01 is 4.628 ns. A delay time (delay tpdf) from an intersection between input signal at input terminals (H01 and H02) and a falling edge (VDD/2 point) of a signal at output terminal N01 is 4.372 ns.

In the lower set of waveforms, when the input voltage is 0.0 V at input terminal H01 and 0.1 V at input terminal H02, the signal amplitude is amplified from 100 mV to 1,360 mV by initial stage differential amplifying circuits (SN1 and SP1), respectively. A delay time (delay tpdr) from an intersection between input signal at input terminals (H01 and H02) and a rising edge of a signal at node (N9 or N13) is 0.685 ns. A delay time (delay tpdf) from an intersection between input signal at input terminals (H01 and H02) and a falling edge of a signal at node (N9 or N13) is 0.714 ns. A delay time (delay tpdr) from an intersection between input signal at input terminals (H01 and H02) and a rising edge (VDD/2 point) of a signal at output terminal N01 is 2.398 ns. A delay time (delay tpdf) from an intersection between input signal at input terminals (H01 and H02) and a falling edge (VDD/2 point) of a signal at output terminal N01 is 2.172 ns.

A difference in delay caused by the difference in input voltage (offset by 0.0 V and offset by 2.1 V) is 1.684 ns in the initial stage differential amplifying circuits (SN1 and SP1) and is 2.456 ns total at output terminal N01.

Differences in output amplitudes and delay times at node N13 for variations in an offset of an input signal at input terminals (H01 and H02) will now be illustrated in FIGS. 14 and 15. FIG. 14 is a circuit schematic diagram of initial stage differential amplifying circuits (SN1 and SP1). FIG. 15 is a diagram illustrating Vd-Id characteristics of transistors in an initial stage amplifying circuit.

Referring now to FIG. 15 in conjunction with FIG. 14. FIG. 15(1) is a diagram illustrating Vd-Id characteristics of transistors in initial stage amplifying circuit SN1 when an input signal at input terminals (H01 and H02) has an offset of 2.1 V. FIG. 15(2) is a diagram illustrating Vd-Id characteristics of transistors in initial stage amplifying circuit SN1 when an input signal at input terminals (H01 and H02) has an offset of 0.0 V. FIG. 15 illustrates Id-Vd graphs of transistors (P2 and P3), the same line for both high and low input potentials received at their respective gates, Id-Vd graphs of transistor N1, and Id-Vd graphs of diode connected transistor N2. Quiescent operating potentials at node N13 are illustrated at intersections of the Id-Vd line of transistor P2 and transistor N1 and labeled as VN13L (low potential at node N13) and VN13H (high potential at node N13).

When an input signal at input terminals (H01 and I02) has an offset that is higher in potential, the on-resistance of transistors (P2 to P5) is increased. With an increased on resistance, transistor P1 has to provide less current and thus the potential at node N10 is higher. As illustrated in FIG. 15(1), when an input signal at input terminals (H01 and H02) has an offset that is higher in potential, the operating range at node N13 has a wide range. This applies equally to node N9.

In contrast, when an input signal at input terminals (H01 and H02) has an offset that is lower in potential, the on-resistance of transistors (P2 to P5) is decreased. With a decreased on resistance, transistor P1 has to provide more current and thus the potential at node N10 is lower. As illustrated in FIG. 15(2), when an input signal at input terminals (H01 and H02) has an offset that is lower in potential, the operating range at node N13 has a narrow range. This applies equally to node N9.

As noted from the above description, the amplitude of the output signals from initial stage input circuits (SN1 and SP1) at nodes (N13 and N9) are smaller when the input signal at input terminals (H01 and H02) has a smaller voltage offset and is larger when the input signal at input terminals (H01 and H02) has a greater voltage offset.

Furthermore, a P-channel transistor (P2 to P5) may have a lower on-resistance when the input signal at input terminals (H01 and H02) has a smaller voltage offset. With a lower on-resistance the output signals from initial stage input circuits (SN1 and SP1) at nodes (N13 and N9) are sharper or faster. A P-channel transistor (P2 to P5) may have a higher on resistance when the input signal at input terminals (H01 and H02) has a larger voltage offset. With a higher on-resistance the output signals from initial stage input circuits (SN1 and SP1) at nodes (N13 and N9) are more sloped or slower.

A delay value caused by the initial stage differential amplifying circuit (SN1 and SP1) from a full swing of the input signal until an intersection of the complementary output signals at nodes (N13 and N9) is proportional to the offset and the inclination (slope) of the output signals. In other words, the delay value becomes smaller as the offset of the input signal at input terminals (H01 and H02) becomes smaller and the delay value becomes smaller as the inclination (ns/V) of the output signals at node (N13 and N9) is smaller.

From the above-description, it can be seen that a propagation delay value for input stage differential amplifying circuits (SN1 and SP1) is smaller when an offset of the input signal at input terminals (H01 and H02) becomes smaller and is greater when an offset of the input signal at input terminals (H01 and H02) becomes greater.

Delay values for input stage differential amplifying circuits (SN1 and SP1) with respect to a voltage offset in an input signal and an inclination (slope) of an output signal results as follows:

The output signal amplitude when an input signal has a high voltage offset is greater than the output signal amplitude when the input signal has a low voltage offset.

The output signal inclination (ns/V) when an input signal has a high voltage offset is greater than the output signal inclination when an input signal has a low voltage offset.

A delay value for an input stage differential amplifying circuit (SN1 and SP1) when an input signal has a high voltage offset is greater than the delay value when an input signal has a low voltage offset.

By having differences in signal delays in a conventional input buffer circuit (such as conventional input buffer circuit 1200), a greater margin must be designed into the latching of input signals to ensure proper functionality. This reduces overall operating speeds.

The above-described problems have been addressed with the addition of an N-channel transistor between initial stage amplifying circuits (SN1 and SP1) as illustrated in FIG. 16. FIG. 16 is a circuit schematic diagram of a conventional approach to solving delay differences in initial stage amplifying circuits (SN1 and SP1). As illustrated in FIG. 16, a n-channel transistor NND has been added. N-channel transistor has a gate connected to VDD, a first source/drain connected to node N13 of initial stage amplifying circuit SN1 and a second source/drain connected to node N9 of initial stage amplifying circuit SP1.

By connecting n-channel transistor NND between nodes. (N9 and N13) a current flows from the higher potential of nodes (N9 and N13) to the lower potential of nodes (N9 and N13). In this way, a difference in potential between nodes (N9 and N13) i s reduced. By reducing the difference in potential between nodes (N9 and N13) the amplitude of the differential signal carried by nodes (N9 and N13) is reduced.

An amplitude and difference in delay in the initial stage amplifying circuits illustrated in FIG. 16 will now be described with reference to FIG. 16 in conjunction with Vd-Id characteristics of transistors illustrated in FIG. 17. FIG. 17 is a diagram illustrating Vd-Id characteristics of transistors in an initial stage amplifying circuit.

FIG. 17(1) is a diagram illustrating Vd-Id characteristics of transistors in initial stage amplifying circuit SN1 when an input signal at input terminals (H01 and H02) has an offset of 2.1 V. FIG. 17(2) is a diagram illustrating Vd-Id characteristics of transistors in initial stage amplifying circuit SN1 when an input signal at input terminals (H01 and H02) has an offset of 0.0 V. FIGS. 17(1) and 17(2) illustrate a case where n-channel transistor NND is included as solid line waveforms and a case where n-channel transistor NND is not included as dashed waveforms. FIG. 17 illustrates Id-Vd graphs of transistors (P2 and P3), the same line for both high and low input potentials received at their respective gates, Id-Vd graphs of transistor N1, and Id-Vd graphs of diode connected transistor N2.

As illustrated in FIG. 17(1), when an input signal at input terminals (H01 and H02) has a high offset, the on-resistance of transistors (P2 to P5) is increased, thus the potential at node N10 is increased. However, the current flowing from the higher potential of nodes (N9 and N13) to the lower potential of nodes (N9 and N13) through transistor NND serves to reduce the potential swing at nodes (N9 and N13).

In the same manner, when an input signal at input terminals (H01 and H02) has a low offset, the on-resistance of transistors (P2 to P5) is decreased, thus the potential at node N10 is decreased. Also, the current flowing from the higher potential of nodes (N9 and N13) to the lower potential of nodes (N9 and N13) through transistor NND serves to further reduce the potential swing at nodes (N9 and N13).

As noted above, the current flows through n-channel transistor NND in all cases, such that the potential swing at nodes (N9 and N13) is always reduced. Because current always flows through n-channel transistor NND, the output inclination (ns/V) becomes smaller.

An illustration will now be made of delay differences in a conventional input buffer (a conventional multi-stage differential amplifying circuit) using n-channel transistor NND connected between outputs of initial stage amplifying circuits by referring to waveforms from a SPICE simulation illustrated in FIG. 18.

FIG. 18 is a waveform diagram illustrating the operation of a conventional input buffer 1200 of FIG. 12 including the n-channel transistor NND included in FIG. 16. The waveform diagram of FIG. 18 illustrates two sets of waveforms. The lower set of waveforms illustrates a case where an input signal at input terminals (H01 and H02) is a 100 mV signal with an offset of 0.0 V (input voltages are 0.0 V to 0.1 V). The upper set of waveforms illustrates a case where an input signal at input terminals (H01 and H02) is a 100 mV signal with an offset of 2.1 V (input voltages are 2.1 V to 2.2 V). All of the waveforms in the upper set have a DC offset of 4.0 V added in order to illustrate different simulation conditions on the same waveform diagram without unduly cluttering the figure. Thus, in the upper set of waveforms ground is at 4.0 V. In order to find the true voltage, 4.0 V must be subtracted from the illustrated voltage output.

Referring now to FIG. 18 in conjunction with FIG. 12 and FIG. 16, in the upper set of waveforms, when the input voltage is 2.1 V at input terminal H01 and 2.2 V at input terminal H02, the signal amplitude is amplified from 100 mV to 783 mV by initial stage differential amplifying circuits (SN1 and SP1), respectively. It is noted that the signal amplitude is reduced by n-channel transistor NND. A delay time from an intersection between input signal at input terminals (H01 and H02) and a rising edge of a signal at node (N9 or N13) is defined as delay tpdr and is 1.011 ns. A delay time from an intersection between input signal at input terminals (H01 and H02) and a falling edge of a signal at node (N9 or N13) is defined as delay tpdf and is 1.021 ns. A delay time (delay tpdr) from an intersection between input signal at input terminals (H01 and H02) and a rising edge (VDD/2 point) of a signal at output terminal N01 is 3.865 ns. A delay time (delay tpdf) from an intersection between input signal at input terminals (H01 and H02) and a falling edge (VDD/2 point) of a signal at output terminal N01 is 3.793 ns.

In the lower set of waveforms, when the input voltage is 0.0 V at input terminal H01 and 0.1 V at input terminal H02, the signal amplitude is amplified from 100 mV to 947 mV by initial stage differential amplifying circuits (SN1 and SP1), respectively. It is noted that the signal amplitude is reduced by n-channel transistor NND. A delay time (delay tpdr) from an intersection between input signal at input terminals (H01 and H02) and a rising edge of a signal at node (N9 or N13) is 0.552 ns. A delay time (delay tpdf) from an intersection between input signal at input terminals (H01 and H02) and a falling edge of a signal at node (N9 or N13) is 0.543 ns. A delay time (delay tpdr) from an intersection between input signal at input terminals (H01 and H02) and a rising edge (VDD/2 point) of a signal at output terminal N01 is 2.625 ns. A delay time (delay tpdf) from an intersection between input signal at input terminals (H01 and H02) and a falling edge (VDD/2 point) of a signal at output terminal N01 is 2.532 ns.

A difference in delay caused by the difference in input voltage (offset by 0.0 V and offset by 2.1 V) is 0.478 ns in the initial stage differential amplifying circuits (SN1 and SP1) and is 1.333 ns total at output terminal N01. N-channel transistor NND connected between the outputs (nodes N9 and N13) of initial stage differential amplifying circuits (SN1 and SP1) reduces a difference in delay in the initial stage amplifying circuits (SN1 and SP1) by reducing a magnitude of a signal at the outputs (nodes N9 and N13). By doing so, the initial stage differential amplifying circuits (SN1 and SP1) have a delay difference reduced to as little as 0.478 ns. However, a delay difference at the output terminal N01 of the conventional input buffer is reduced to 1.333 ns (a 0.855 ns improvement). A delay difference of 1.333 ns can still inhibit high frequency signal transfer/reception, and can inhibit overall high frequency performance.

In view of the above discussion, it would be desirable to provide differential amplifying circuit in which high speed may be achieved by reducing a difference in delay time caused by differing offsets of an input signal. It would also be desirable to provide a multi-stage differential amplifying circuit using the same.

SUMMARY OF THE INVENTION

According to the present embodiments, a multi-stage differential amplifying circuit may include initial stage differential amplifying circuits. Initial stage amplifying circuits may receive an input signal at input terminals and provide a differential output signal at output nodes. An amplitude controlling transistor may provide a controllable impedance path between the output nodes. An amplitude controlling transistor may have a control gate connected to a current supply node. The controllable impedance path may be controlled so that a magnitude of a differential output signal at output nodes may be more consistent even when an offset voltage of an input signal at input terminals varies. A next stage differential amplifying circuit may receive the differential output signal at output nodes and provide an output signal at an output terminal.

According to one aspect of the embodiments, a differential amplifying circuit may include first and second input terminals coupled to receive an input signal. A current source may be coupled between a power supply and a current supplying terminal. An amplitude controlling transistor may provide a controllable impedance path between a forward and a reverse output terminal. The amplitude controlling transistor may have a gate connected to the current supplying terminal.

According to another aspect of the embodiments, a first input transistor may have a gate coupled to the first input terminal. A second input transistor may have a gate coupled to the second input terminal. The first and second input transistors may be insulated gate field effect transistors (IGFETs).

According to another aspect of the embodiments, the forward and reverse output signals may be provided as an input to a next stage circuit. The next stage circuit may include at least one transistor having a first gate oxide thickness. The first and second input transistors may have a second gate oxide thickness that may be thicker than the first gate oxide thickness.

According to another aspect of the embodiments, the differential amplifier circuit may be included in an input buffer circuit on an integrated circuit.

According to another aspect of the embodiments, a multi-stage differential amplifying circuit may include a first differential amplifying circuit. The first differential amplifying circuit may receive an input signal at first and second input terminals and may provide a differential output signal at a forward and a reverse output terminal. The first differential amplifying circuit may include a first input transistor having a gate coupled to the first input terminal and a second input transistor having a gate coupled to the second input terminal. A current source may be coupled between a first power supply and a current supply node. The current supply node may provide current to the first and second input transistors. An amplitude controlling transistor may have a gate coupled to the current supply node and may provide a controllable impedance path between a forward and a reverse output terminal. A second differential amplifying circuit may be coupled to receive the differential output signal and provide a multi-stage output signal.

According to another aspect of the, embodiments, the first and second IGFETs may have a first conductivity type and the amplitude controlling transistor may be an IGFET having a second conductivity type.

According to another aspect of the embodiments, the first conductivity type may be a p-type and the second conductivity type may be an n-type.

According to another aspect of the embodiments, the first conductivity type may be an n-type and the second conductivity type may be a p-type.

According to another aspect of the embodiments, the second differential amplifying circuit may include at least one IGFET having a first gate oxide thickness. The first and second input transistors may have a second gate oxide thickness that is thicker than the first gate oxide thickness.

According to another aspect of the embodiments, the second differential amplifying circuit may be coupled to operate from a second power supply. The second power supply. may have a lower potential than the first power supply.

According to another aspect of the embodiments, the multi-stage differential amplifying circuit may be included in an input buffer circuit on an integrated circuit.

According to another aspect of the embodiments, a differential amplifying circuit may include a first differential amplifying circuit. The first differential amplifying circuit may be coupled to receive a differential input signal from a first and second input terminal and provide a differential output signal at a forward and a reverse output terminal. An amplitude controlling IGFET may provide a controllable impedance path between the forward and reverse output terminals. A potential at a control gate of the amplitude controlling IGFET may vary as an offset voltage of the differential input signal varies.

According to another aspect of the embodiments, an impedance of the controllable impedance path may be lower when the offset voltage is a first potential than when the offset voltage is a second potential.

According to another aspect of the embodiments, the first differential amplifying circuit may include a first input IGFET and a second input IGFET. The first input IGFET may have a first control gate coupled to the first input terminal and the second input IGFET may have a second control gate coupled to the second input terminal. The first and second IGFETs may have a p-type conductivity and the amplitude controlling IGFET may have an n-type conductivity.

According to another aspect of the embodiments, the first differential amplifying circuit may include a first input IGFET and a second input IGFET. The first input IGFET may have a first control gate coupled to the first input terminal and the second input IGFET may have a second control gate coupled to the second input terminal. The first and second IGFETs may have an n-type conductivity and the amplitude controlling IGFET may have a p-type conductivity.

According to another aspect of the embodiments, a second differential amplifying circuit may be coupled to receive the differential output signal and provide a multi-stage output signal.

According to another aspect of the embodiments, the first differential amplifying circuit may be coupled to operate from a first power supply and the second differential amplifying circuit may be coupled to operate from a second power supply. The first power supply may have a higher potential than the second power supply.

DETAILED DESCRIPTION OF THE EMBODIMENTS

Various embodiments of the present invention will now be described in detail with reference to a number of drawings.

Figure 1:
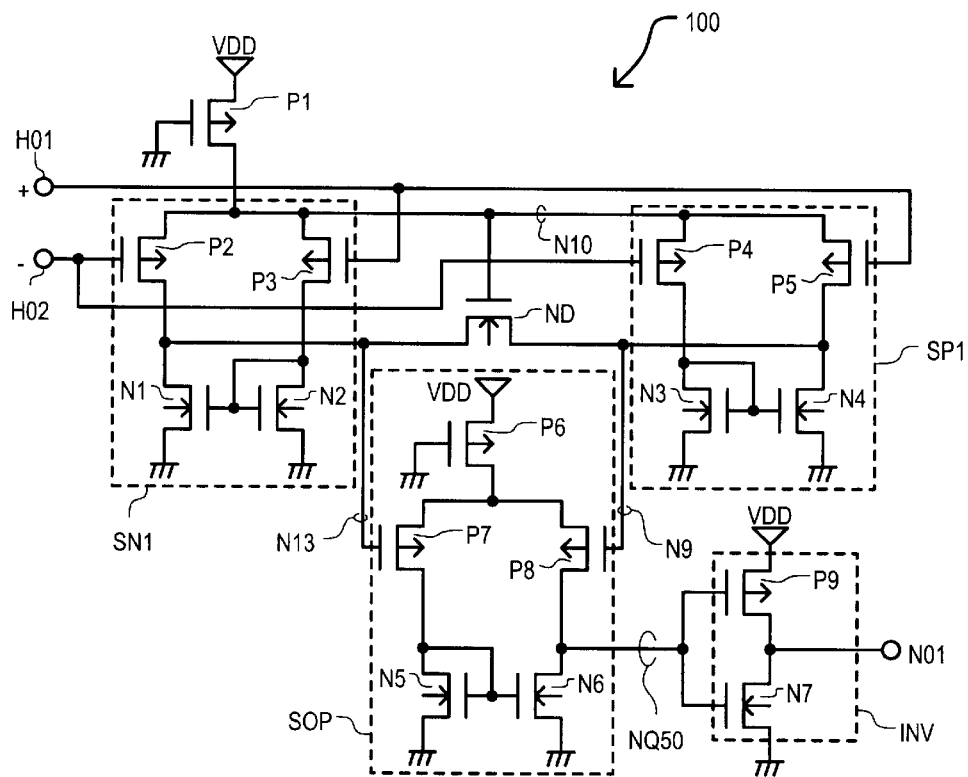
FIG. 1 is a circuit schematic diagram of a multi-stage differential amplifying circuit according to a first embodiment.

Referring to FIG. 1, a multi-stage differential amplifying circuit according to an embodiment is set forth in a circuit schematic diagram and given the general reference character 100. Multi-stage differential amplifying circuit 100 may include similar constituents as conventional differential amplifying circuit 1200 and such similar constituents may be referred to by the same reference characters.

Multi-stage differential amplifying circuit 100 may receive an input signal at input terminals (H01 and H02) and may provide an output at an output terminal N01. A logic level at output terminal N01 may be based on a polarity of a potential difference of an input signal at input terminals (H01 and H02).

Multi-stage differential amplifying circuit 100 may include a transistor P1, initial stage differential amplifying circuits (SN1 and SP1), a next stage differential amplifying circuit SOP, an inverter INV, and an amplitude controlling transistor ND.

Transistor P1 may have a source connected to a power supply VDD, a drain connected to node N10, and a gate connected to ground (VSS). Transistor P1 may serve as a current source. Transistor P1 may be a p-channel IGFET (insulated gate field effect transistor). Node N10 may be considered a current supplying terminal.

Initial stage differential amplifying circuit SN1 may include transistors (P2, P3, N1 and N2). Transistor N1 may have a source connected to ground, a drain connected to a drain of transistor P2 at node N13, and a gate.connected to a gate of transistor N2 and a common drain connection of transistors (N2 and P3). Transistor N2 may have a source connected to ground, a gate and drain commonly connected to a gate of transistor N1 and a drain of transistor P3. Transistor P2 may have a source connected to node N10, a drain connected to a drain of transistor N1 at node N13, and a gate connected to receive an input signal at input terminal H02. Transistor P3 may have a source connected to node N10, a drain connected to a drain of transistor N2 and a common gate connection of transistors (N1 and N2), and a gate connected to receive an input signal at input terminal H01. Transistors (N1 and N2) may be n-channel IGFETs and transistors (P2 and P3) may be p-channel IGFETs.

Initial stage differential amplifying circuit SP1 may include transistors (P4, P5, N3 and N4). Transistor N4 may have a source connected to ground, a drain connected to a drain of transistor P5 at node N9, and a gate connected to a gate of transistor N3 and a common drain connection of transistors (N3 and P4). Transistor N3 may have a source connected to ground, a gate and drain commonly connected to a gate of transistor N4 and a drain of transistor P4. Transistor P5 may have a source connected to node N10, a drain connected to a drain of transistor N4 at node N9, and a gate connected to receive an input signal at input terminal H01. Transistor P4 may have a source connected to node N10, a drain connected to a drain of transistor N3 and a common gate connection of transistors (N3 and N4), and a gate connected to receive an input signal at input terminal H02. Transistors (N3 and N4) may be n-channel IGFETs and transistors (P4 and P5) may be p-channel IGFETs.

Next stage differential amplifying circuit SOP may include transistors (P6, P7, P8, N5 and N6). Transistor N6 may have a source connected to ground, a drain connected to a drain of transistor P8 at node NQ50, and a gate connected to a gate of transistor N5 and a common drain connection of transistors (N5 and P7). Transistor N5 may have a source connected to ground, a gate and drain commonly connected to a gate of transistor N6 and a drain of transistor P7. Transistor P8 may have a source connected to a drain of transistor P6, a drain connected to a drain of transistor N6 at node NQ50, and a gate connected to node N9. Transistor P7 may have a source connected to a drain of transistor P6, a drain connected to a drain of transistor N5 and a common gate connection of transistors (N5 and N6), and a gate connected to node N13. Transistor P6 may have a source connected to a power supply (VDD) a drain connected to a common source connection of transistors (P7 and P8), and a gate connected to ground. Transistors (N5 and N6) may be n-channel IGFETs and transistors (P6, P7 and P8) may be p-channel IGFETs.

Inverter INV may include transistors (N7 and P9). Transistor N7 may have a source connected to ground a drain connected to output terminal N01, and a gate connected to node NQ50. Transistor P9 may have a source connected to a power supply (VDD) a drain connected to output terminal N01, and a gate connected to node NQ50. Transistor N7 may be an n-channel IGFET and transistor P9 may be a p-channel IGFET.

Amplitude controlling transistor ND may have a first source/drain connected to node N9, a second source/drain connected to node N13, and a gate connected to node N10. Amplitude controlling transistor ND may be a n-channel IGFET.

Input terminal H01 may be a forward input terminal. Input terminal H02 may be considered a reverse input terminal. Initial stage differential amplifying circuits (SN1 and SP1) may receive a signal at input terminals (H01 and H02) and may provide an amplified output signal at nodes (N9 and N13). Next stage differential amplifying circuit SOP may receive the signal at nodes (N9 and N13) and may provide further amplification to provide an output signal at node NQ50. Inverter INV may receive the signal at node NQ50 and provides buffering and/or wave shaping and provide an output signal at output terminal N01.

Amplitude controlling transistor ND may be provided to control the output amplitudes of initial stage differential amplifying circuits (SN1 and SP1). Amplitude controlling transistor ND may be controlled so as to control the resistance of a current path between nodes (N9 and N13). In this way, variations in the amplitudes of signals at nodes (N9 and N13) may be controlled.

In multi-stage differential amplifying circuit 100, amplitudes of the outputs of initial stage differential amplifying circuits (SP1 and SN1) may be controlled. In this way, an input signal at input terminals (H01 and H02) having a small amplitude may have a wide voltage offset range and be stably amplified and output at output terminal N01.

The operation of multi-stage differential amplifying circuit 100 will now be described.

When a differential signal having a small amplitude is input into input terminals (H01 and H02), respectively, initial stage differential amplifying circuits (SN1 and SP1) may amplify a difference in potential applied to input terminals (H01 and H02). In this way, initial stage differential amplifying circuits (SN1 and SP1) may provide initial stage output signals at nodes (N13 and N9), respectively. A signal at input terminal H01 may be a forward input signal and a signal at input terminal H02 may be a reverse input signal. Initial stage differential amplifying circuit SN1 may provide a forward initial stage output signal at node N13. Initial stage differential amplifying circuit SP1 may provide a reverse initial stage output signal at node N9. In other words, if a potential at input terminal H01 is higher than a potential at input terminal H02, a potential at node N13 may be higher than a potential at node N9. Likewise, if a potential at input terminal H02 is higher than a potential at input terminal H01, a potential at node N9 may be higher than a potential at node N13.

As noted before, an amplitude controlling transistor ND may provide a controllable current path between nodes (N9 and N13). The current path provided by amplitude controlling transistor ND may be controlled by a voltage at node N10. If a low amplitude differential signal provided at input terminals (H01 and H02) has a high offset potential, transistors (P2 to P5) may have an increased on-resistance and a potential at node N10 may be relatively high. In this case, amplitude controlling transistor ND may provide a lower impedance path between nodes (N9 and N13) when functioning to decrease a potential difference between nodes (N9 and N13). However, if a low amplitude differential signal provided at input terminals (H01 and H02) has a low offset potential, transistors (P2 to P5) may have a decreased on-resistance and a potential at node N10 may be relatively low. In this case, amplitude controlling transistor ND may provide a higher impedance path between nodes (N9 and N13) when functioning to decrease a potential difference between nodes (N9 and N13).

In this way, amplitude controlling transistor ND may have a greater potential decreasing effect on nodes (N9 and N13) when initial stage differential amplifying circuits (SN1 and SP1) may have a capability of providing a greater signal output swing. By doing so, a greater signal output swing may be suppressed.

By controlling an impedance value of amplitude controlling transistor ND in accordance with an offset potential applied to a low amplitude differential signal at input terminals (H01 and H02), it may be possible to reduce a difference in a delay of initial stage differential amplifying circuits (SP1 and SN1) and next stage differential amplifying circuit SOP.

When a differential signal is input at input terminals (H01 and H02), respectively, initial stage differential amplifying circuit SP1 may amplify a difference in potential and provide an amplified output at node N9. In the meantime, initial stage differential amplifying circuit SN1 may amplify a difference in potential and provide an amplified output at node N13.

Current may flow between nodes (N9 and N13) through a current path provided by amplitude controlling transistor ND from a higher potential to a lower potential, so that an amplitude of a differential signal at nodes (N9 and N13) may be reduced. In this way, amplitude controlling transistor ND may provide a controllable impedance path between nodes (N9 and N13) to control an amplitude of a differential signal at nodes (N9 and N13).

Next stage amplifying circuit SOP may receive the differential signal from nodes (N9 and N13) and may provide further amplification to provide a signal output at node NQ50. Inverter INV may receive the signal from node NQ50 and provide a signal at output terminal N01. The signal at output terminal N01 may have a full VDD voltage swing. That is, a logic high may be at VDD and a logic low may be at ground, as an example.

It is noted that the signal at output terminal N01 may be logically inverted as compared to a differential signal input at input terminals (H01 and H02). However, an inverter may be added to provide a non-inverted logic output at output terminal N01.

Figure 2:
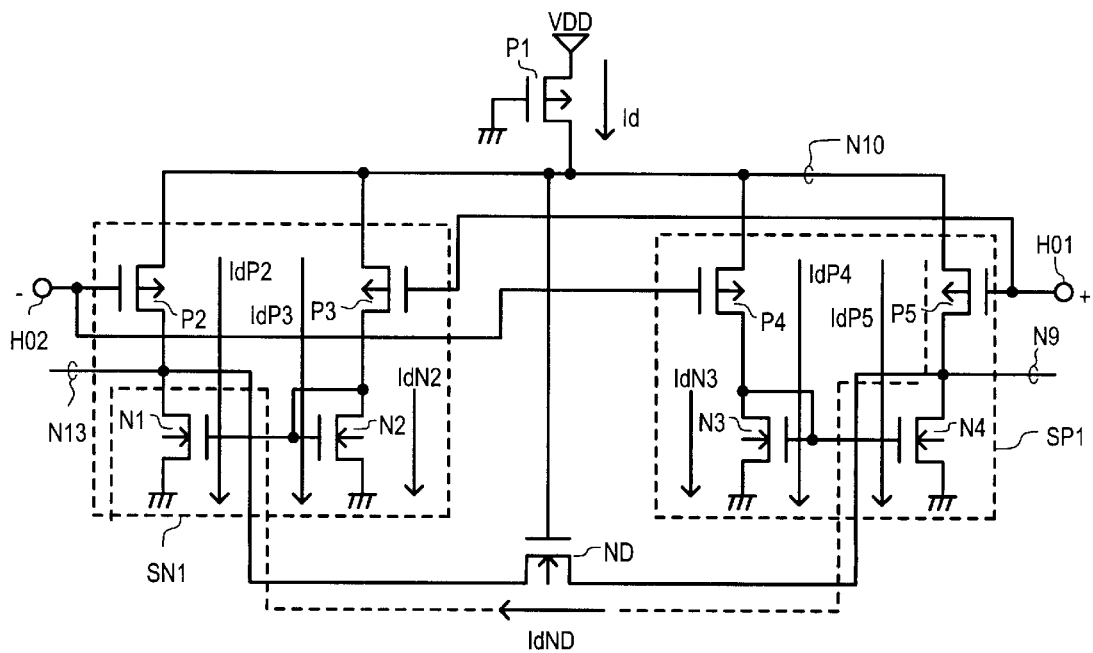
FIG. 2 is a circuit schematic diagram of initial stage differential amplifying circuits according to an embodiment.
Figure 3:
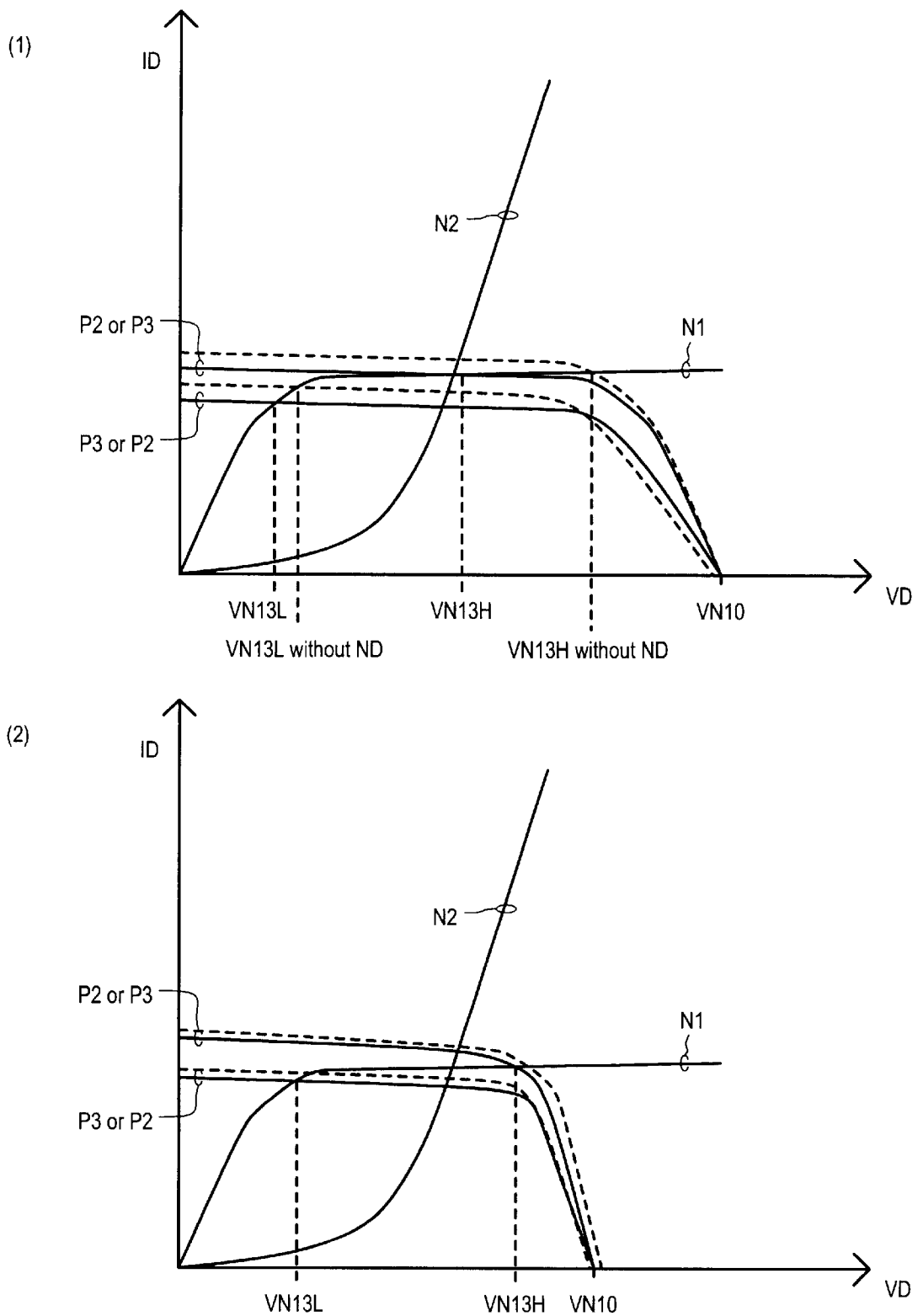
FIGS. 3(1) and 3(2) are diagrams illustrating Vd-Id characteristics of transistors in an initial stage amplifying circuit.

Differences in output amplitudes and delay times at node N13 for variations in an offset of an input signal at input terminals (H01 and H02) will now be illustrated in FIGS. 2 and 3. FIG. 2 is a circuit schematic diagram of initial stage differential amplifying circuits (SN1 and SP1), transistor P1, and amplitude controlling transistor ND. FIG. 3 is a diagram illustrating Vd-Id characteristics of transistors in an initial stage amplifying circuit (SN1 and Referring now to FIG. 3 in conjunction with FIG. 2. FIG. 3(1) is a diagram illustrating Vd-Id characteristics of transistors in initial stage amplifying circuit SN1 when an input signal at input terminals (H01 and H02) has an offset of 2.1 V. FIG. 3(2) is a diagram illustrating Vd-Id characteristics of transistors in initial stage amplifying circuit SN1 when an input signal at input terminals (H01 and H02) has an offset of 0.0 V. FIG. 3 illustrates Id-Vd graphs of transistors (P2 and P3), the same line for both high and low input potentials received at their respective gates, Id-Vd graphs of transistor N1, and Id-Vd graphs of diode connected transistor N2. Quiescent operating-potentials at node N13 may be illustrated at intersections of the Id-Vd line of transistor P2 and transistor N1 and labeled as VN13L (low potential at node N13) and VN13H (high potential at node N13). For illustrative purposes, Id-Vd graphs of transistors (P2 and P3) when an amplitude controlling transistor is not included is indicated by dashed lines.

When an input signal at input terminals (H01 and H02) has an offset that is higher in potential, the on-resistance of transistors (P2 to P5) may be increased. With an increased on resistance, transistor P1 may provide less current (Id) and thus the potential at node N10 may be higher. As illustrated in FIG. 3(1), when an input signal at input terminals (H01 and H02) has an offset that is higher in potential, a potential at node N10 may be relatively high. With a potential at node N10 relatively high, a controllable impedance provided by amplitude controlling transistor ND between nodes (N9 and N13) may be reduced. Thus a current (IdND) may be increased. By increasing a current (IdND) flowing through amplitude controlling transistor ND, an amplitude of an output signal from initial stage differential amplifying circuits (SN1 and SP1) may be reduced as compared to a conventional approach in which no amplitude controlling transistor ND is used.

Figure 16:
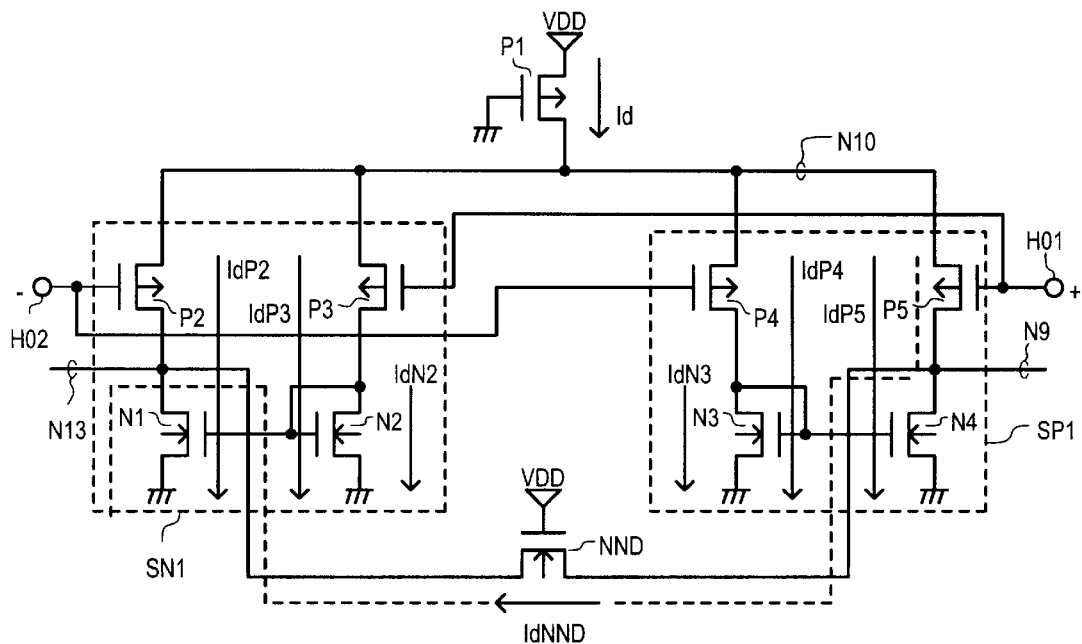
FIG. 16 is a circuit schematic diagram of a conventional approach to solving delay differences in initial stage amplifying circuits.
Figure 15:
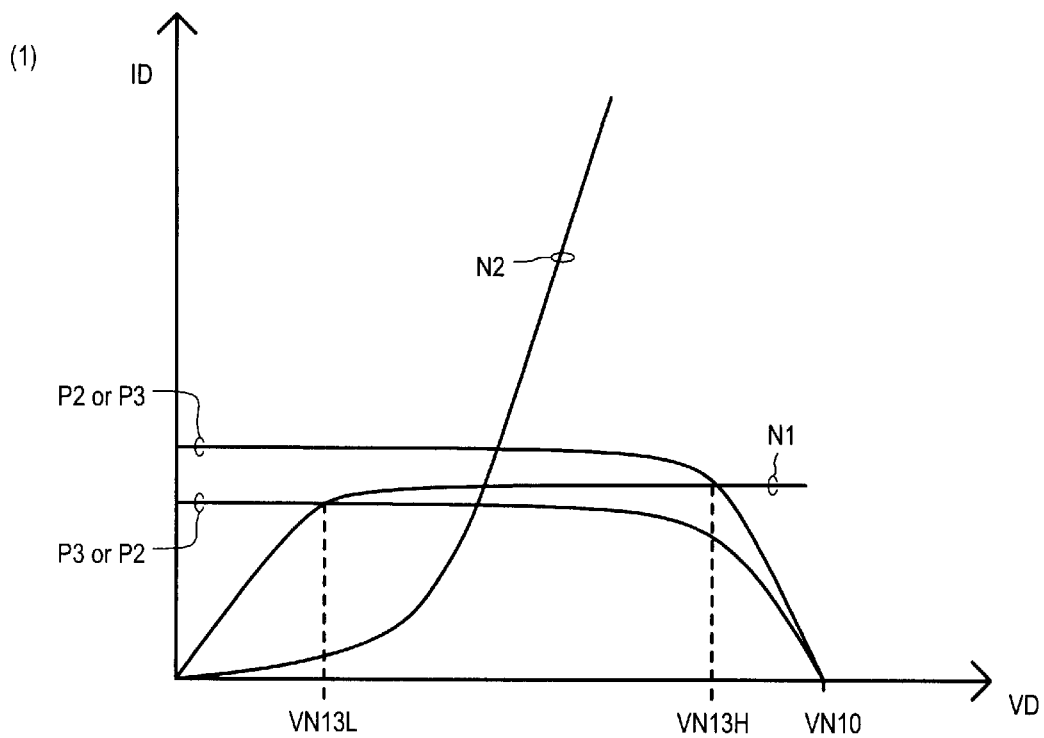
FIGS. 15(1) and 15(2) are diagrams illustrating Vd-Id characteristics of transistors in an initial stage amplifying circuit.
Figure 15:
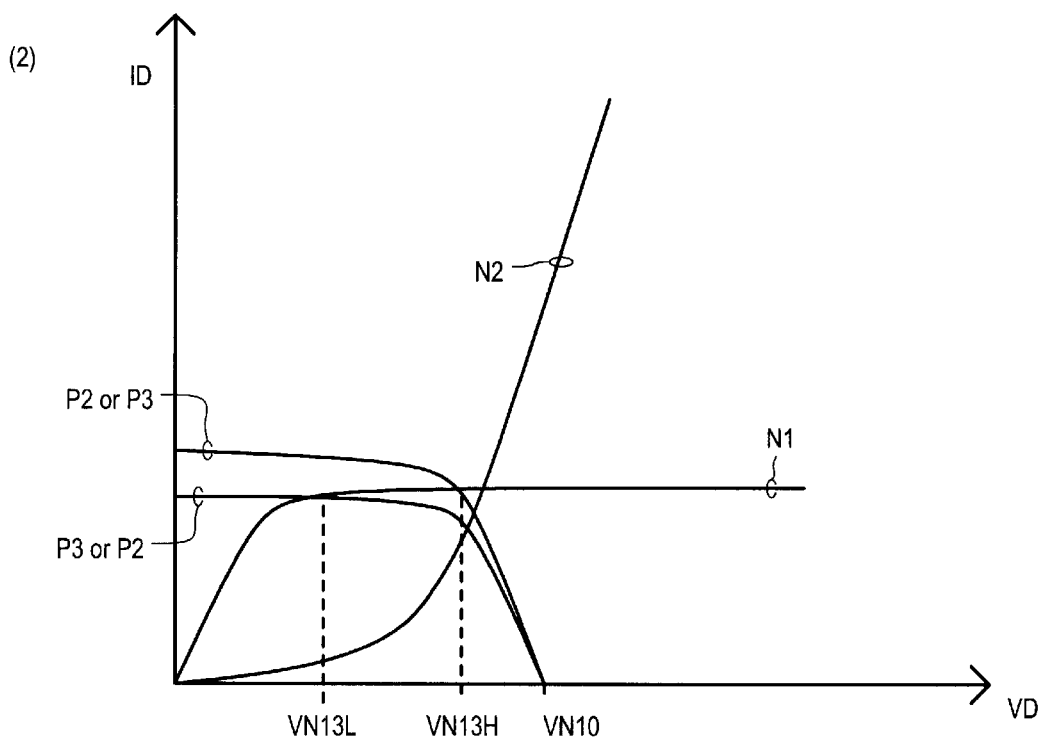
Figure 17:
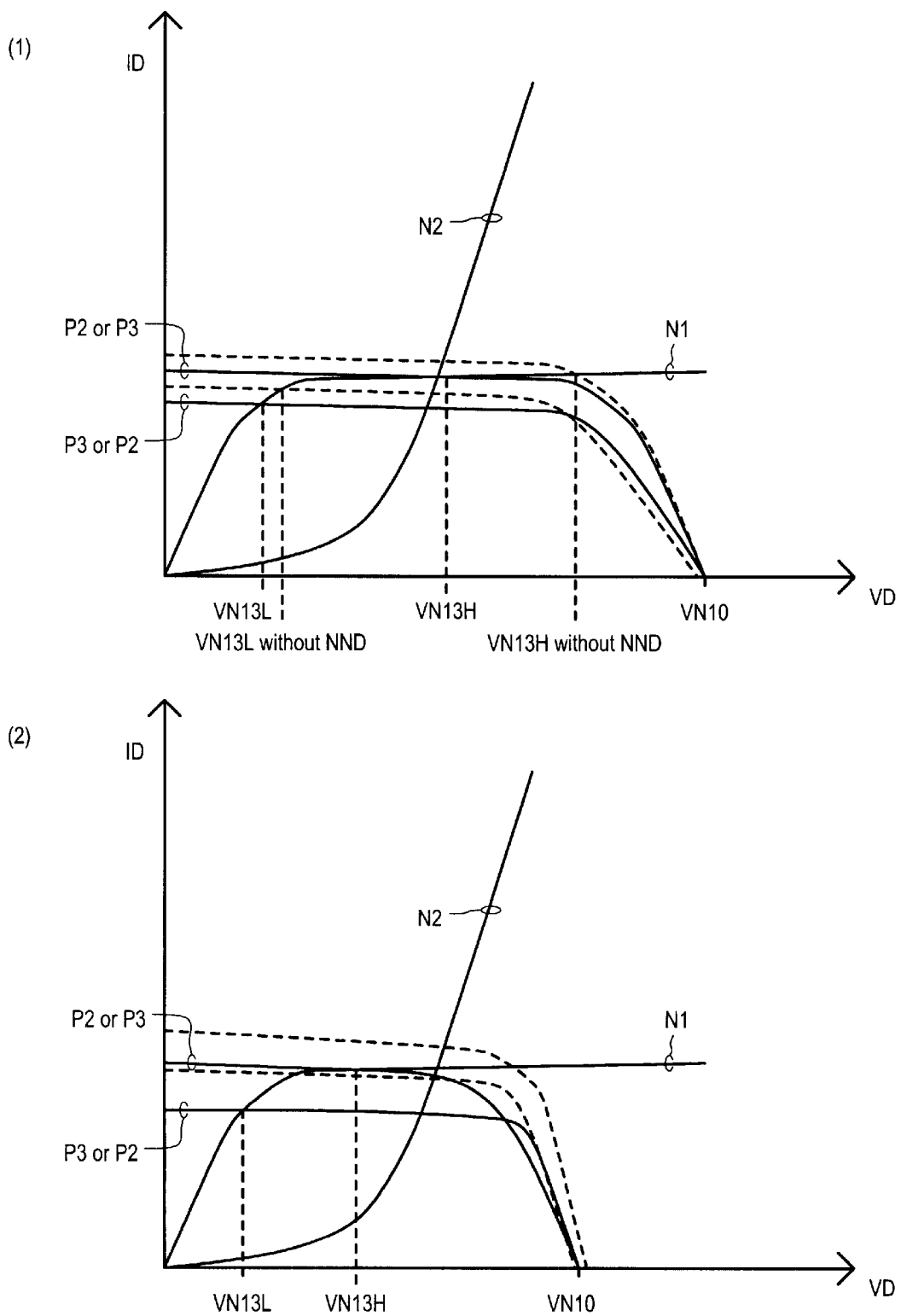
FIGS. 17(1) and 17(2) are diagrams illustrating Vd-Id characteristics of transistors in an initial stage amplifying circuit.
Figure 18:
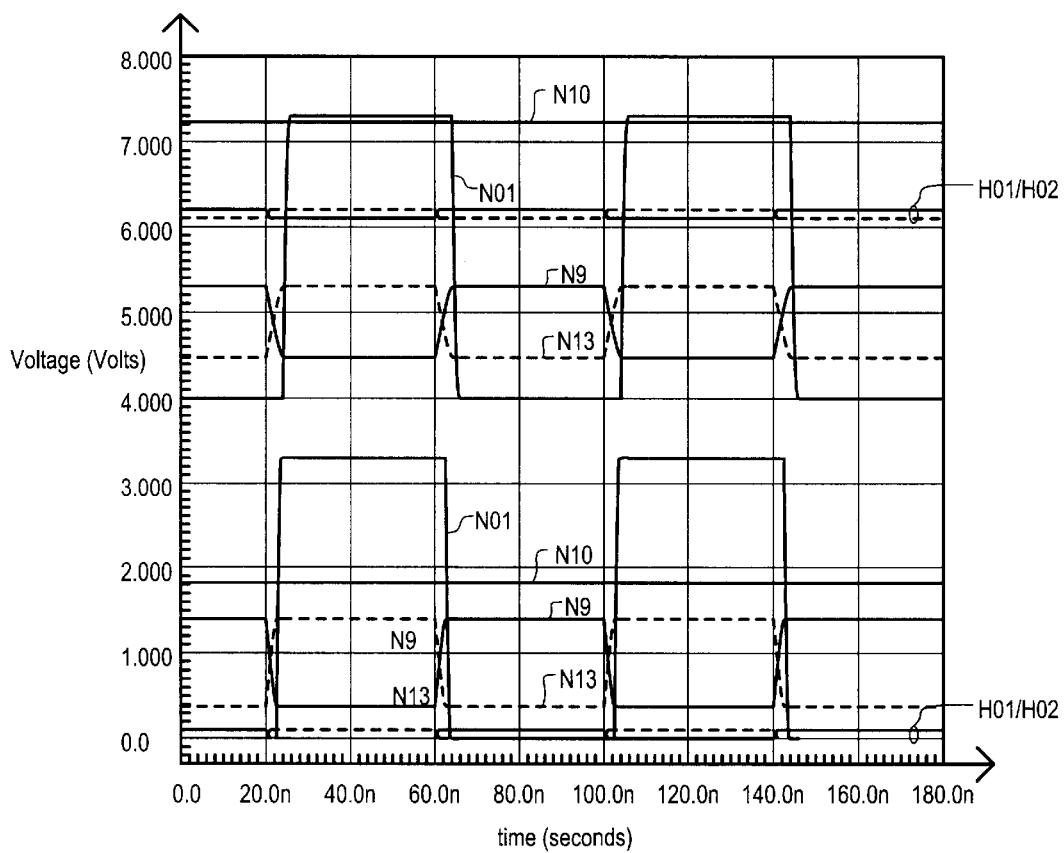
FIG. 18 is a waveform diagram illustrating the operation of a conventional input buffer.

In contrast, when an input signal at input terminals (H01 and H02) has an offset that is lower in potential, the on-resistance of transistors (P2 to P5) may be decreased. With a decreased on-resistance, transistor P1 may provide more current (Id) and thus the potential at node N10 may be lower. As illustrated in FIG. 3(2), when an input signal at input terminals (H01 and H02) has an offset that is lower in potential, a potential at node N10 may be lower. With a potential at node N10 lower, a controllable impedance provided by amplitude controlling transistor ND between nodes (N9 and N13) may be increased. Thus, a current (IdND) may be decreased. By providing a current (IdND) flowing through amplitude controlling transistor ND, an amplitude of an output signal from initial stage differential amplifying circuits (SN1 and SP1) may be reduced as compared to a conventional approach in which no amplitude controlling transistor ND is used. However, by decreasing a current (IdND) flowing through amplitude controlling transistor ND, an amplitude of an output signal from initial stage differential amplifying circuits (SN1 and SP1) may not be reduced as much as compared to a conventional approach as illustrated in FIG. 16 in which n-channel transistor NND is used.

In this way, an amplitude of an output signal from initial stage differential amplifying circuits (SN1 and SP1), in the case where an offset voltage is small (such as illustrated in FIG. 3(2)), may more closely match an amplitude of an output signal from initial stage differential amplifying circuits (SN1 and SP1) in the case where an offset voltage is large (such as illustrated in FIG. 3(1)) as compared to conventional approaches. By doing so, an output inclination (slope) of an output signal from initial stage differential amplifying circuits (SN1 and SP1), in the case where an offset voltage is small, may more closely match an output inclination (slope) of an output signal from initial stage differential amplifying circuits (SN1 and SP1) in the case where an offset voltage is large.

In conventional approaches, an amplitude of an output signal from initial stage differential amplifying circuits (SN1 and SP1) may be larger when an input signal has an increased offset voltage. In the present embodiment, an impedance of an amplitude controlling transistor ND may be controlled so that a difference in an amplitude of an output signal from initial stage amplifying circuits (SN1 and SP1) may have a reduced range (variation) when an offset voltage of an input signal varies. An impedance of an amplitude controlling transistor ND may be controlled and may have a lower impedance when an input signal has a higher offset voltage and may have a higher impedance when an input signal has a lower offset voltage.

It is noted that the amplitude of the output signal from initial stage amplifying circuits (SN1 and SP1) may influence a propagation delay of a next stage differential amplifying circuit SOP. Accordingly, by providing a more consistent amplitude when an offset voltage of an input signal varies, a propagation delay of a next stage differential amplifying circuit SOP may be more consistent.

An illustration will now be made of the operation of multi-stage differential amplifying circuit 100 by referring to waveforms from a SPICE simulation illustrated in FIG. 4.

Figure 4:
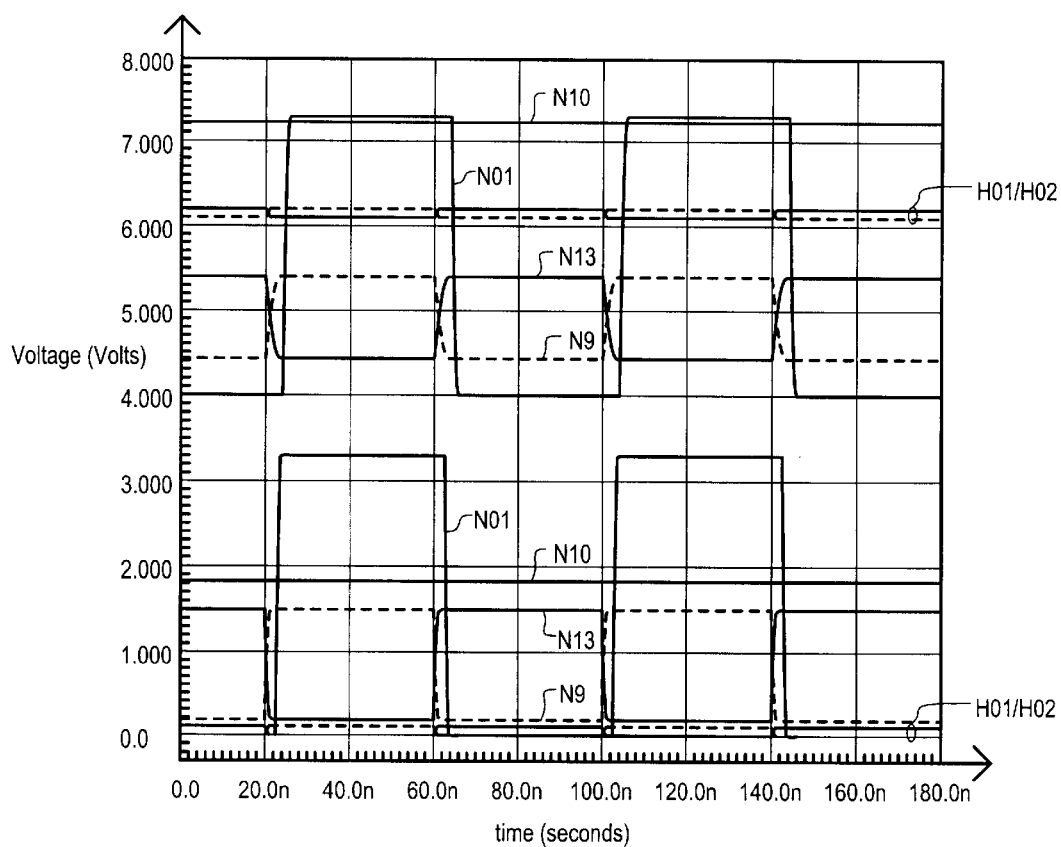
FIG. 4 is a waveform diagram illustrating the operation of a multi-stage differential amplifying circuit according to an embodiment.

FIG. 4 is a waveform diagram illustrating the operation of a multi-stage differential amplifying circuit 100 of FIG. 1. The waveform diagram of FIG. 4 illustrates two sets of waveforms. The lower set of waveforms illustrates a case where an input signal at input terminals (H01 and H02) is a 100 mV signal with an offset of 0.0 V (input voltages are 0.0 V to 0.1 V). The upper set of waveforms illustrates a case where an input signal at input terminals (H01 and H02) is a 100 mV signal with an offset of 2.1 V (input voltages are 2.1 V to 2.2 V). All of the waveforms in the upper set have a DC offset of 4.0 V added in order to illustrate different simulation conditions on the same waveform diagram without unduly cluttering the figure. Thus, in the upper set of waveforms ground is at 4.0 V. In order to find the true voltage, 4.0 V must be subtracted from the illustrated voltage output.

Referring now to FIG. 4 in conjunction with FIG. 2 and FIG. 1, in the upper set of waveforms, when the input signal at input terminals (H01 and H02) is a 100 mV signal with an offset voltage of 2.1 V, the potential at node N10 becomes about 3.22 V and thus, the on-resistance of amplitude controlling transistor ND may become lower. In this case, the signal amplitude is amplified from 100 mV to about 1,044 mV by initial stage differential amplifying circuits (SN1 and SP1), respectively. It is noted, with the on-resistance of amplitude controlling transistor ND lower, the signal amplitude may be reduced by amplitude controlling transistor ND and the output signal at nodes (N9 and N13) may have a more gentle slope. A delay time (tpdr) from an intersection between input signal at input terminals (H01 and H02) and a rising edge of a signal at node (N9 or N13) is about 1.133 ns. A delay time (tpdf) from an intersection between input signal at input terminals (H01 and H02) and a falling edge of a signal at node (N9 or N13) is about 1.119 ns. A delay time (delay tpdr) from an intersection between input signal at input terminals (H01 and H02) and a rising edge (VDD/2 point) of a signal at output terminal N01 is about 3.096 ns. A delay time (delay tpdf) from an intersection between input signal at input terminals (H01 and H02) and a falling edge (VDD/2 point) of a signal at output terminal N01 is about 3.000 ns.

Referring still to FIG. 4 in conjunction with FIG. 2 and FIG. 1, in the lower set of waveforms, when the input signal at input terminals (H01 and H02) is a 100 mV signal with an offset voltage of 0.0 V, the potential at node 10 becomes about 1.83 V and thus, the on-resistance of amplitude controlling transistor ND may become higher. In this case, the signal amplitude is amplified from 100 mV to about 1,352 mV by initial stage differential amplifying circuits (SN1 and SP1), respectively. Because the on-resistance of amplitude controlling transistor ND is higher, amplitude controlling transistor ND may have less effect on the amplitude of output signals at nodes (N9 and N13). In this way, the output signal (N9 and N13) may keep a relatively sharp slope. A delay time (tpdr) from an intersection between input signal at input terminals (H01 and H02) and a rising edge of a signal at node (N9 or N13) is about 0.691 ns. A delay time (tpdf) from an intersection between input signal at input terminals (H01 and H02) and a falling edge of a signal at node (N9 or N13) is about 0.683 ns. A delay time (delay tpdr) from an intersection between input signal at input terminals (H01 and H02) and a rising edge (VDD/2 point) of a signal at output terminal N01 is about 2.420 ns. A delay time (delay tpdf) from an intersection between input signal at input terminals (H01 and H02) and a falling edge (VDD/2 point) of a signal at output terminal N01 is about 2.414 ns.

A difference in delay caused by a difference in an input voltage offset may be reduced to about 0.45 ns in initial stage amplifying circuits (SN1 and SP1) and may be reduced to about 0.232 ns in the next stage differential amplifying circuit SOP and inverter INV. In this way, a total difference in delay in a multi-stage differential amplifying circuit 100 caused by a difference in an input voltage offset may be reduced to a total of about 0.683 ns.

As described above, transistor P1 may provide a current to initial stage differential amplifying circuits (SN1 and SP1) through node N10. A resistive value of transistors (P2 to P5) may change in accordance with a potential offset of a small amplitude signal provided to input terminals (H01 and H02). As a resistive value of transistors (P2 to P5) change, a potential at node N10 may change. Amplitude controlling transistor ND may have a control terminal (gate) connected to node N10. In this way, when a potential offset of a small amplitude signal provided to input terminals (H01 and H02) changes, a controllable impedance of amplitude controlling transistor ND may change accordingly. By doing so, a delay value of initial stage differential amplifying circuits (SN1 and SP1) may be more consistent and high frequency operation may be improved.

Figure 5:
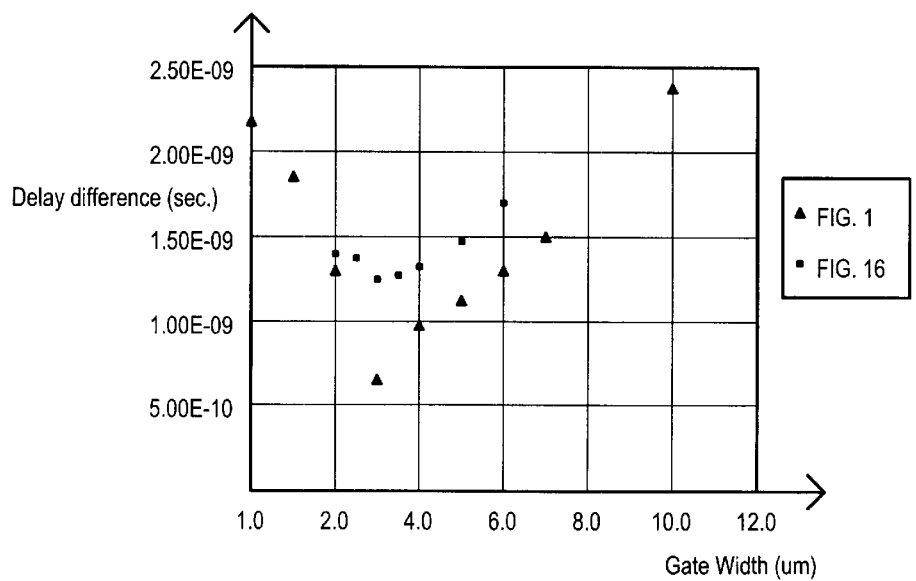
FIG. 5 is a graph illustrating a difference of delay versus a gate width of amplitude controlling transistor in initial stage differential amplifying circuits in a multi-stage differential amplifying circuit according to an embodiment.

FIG. 5 is a graph illustrating a difference of delay versus a gate width of amplitude controlling transistor ND in initial stage differential amplifying circuits (SN1 and SP1) in multi-stage differential amplifying circuit 100. In FIG. 5, a delay according to the present embodiment is illustrated by triangle-shaped data points. Also illustrated in FIG. 5 is a difference of delay versus a gate width of amplitude n-channel transistor NND (FIG. 16) in initial stage differential amplifying circuits (SN1 and SP1) in a conventional multi-stage differential amplifying circuit. In FIG. 5, a delay according to the conventional approach is illustrated by square shaped data points.

Referring now to FIG. 5, it is found that there are gate widths in which a difference in delay in the present embodiment as illustrated in FIGS. 1 and 2 may be smaller than a difference in delay in a conventional approach as illustrated in FIG. 16. This may be due to a suppression of variations in amplitude of an output signal at nodes (N9 and N13) in accordance with an offset voltage of an input signal at input terminals (H01 and H02). This may be accomplished by varying a resistance value of amplitude controlling transistor ND by varying a potential at a control gate. In the conventional approach, a resistance value of n-channel transistor NND may be kept essentially constant by keeping the same potential applied to a control gate. In the present embodiment, a difference in delay may be improved by about two-fold as compared to the conventional approach.

Figure 12:
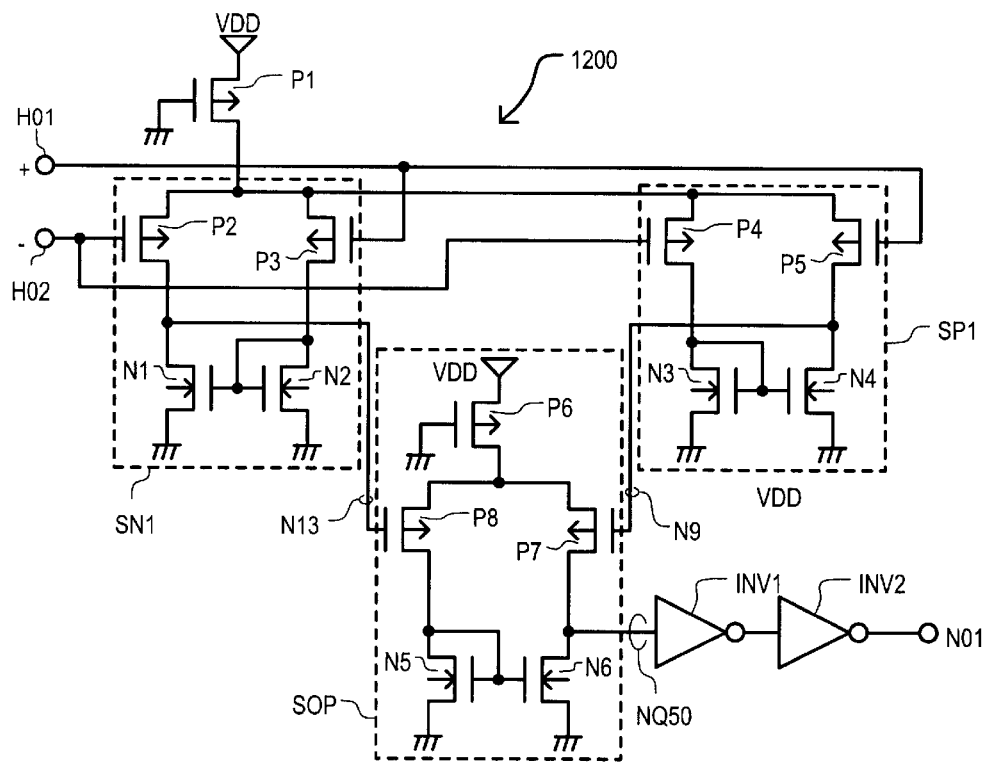
FIG. 12 is a circuit schematic diagram of a conventional input buffer.
Figure 14:
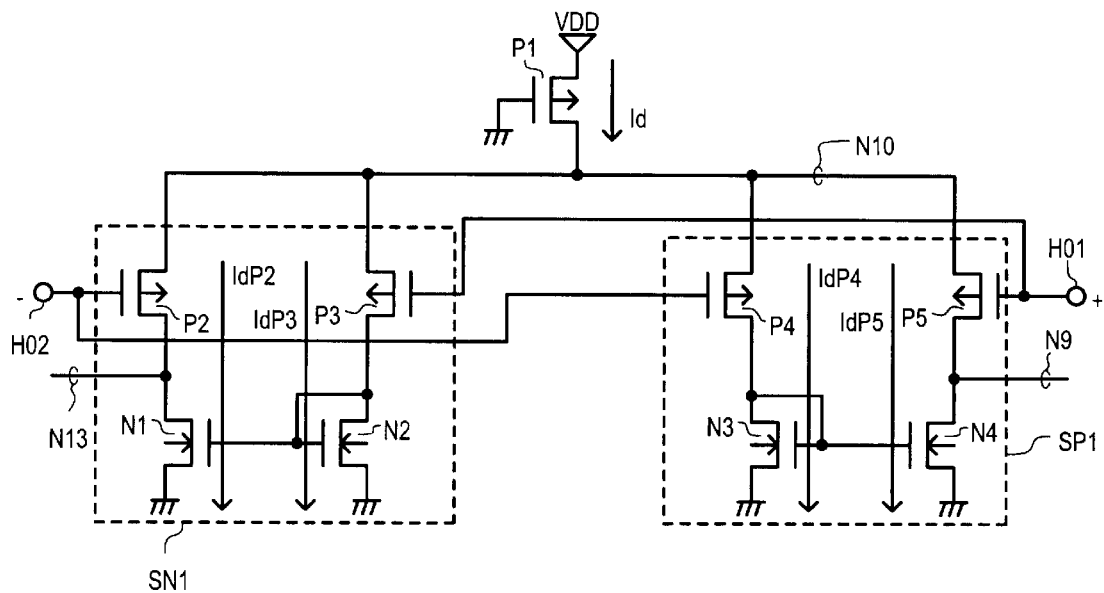
FIG. 14 is a circuit schematic diagram of initial stage differential amplifying circuits.
Figure 13:
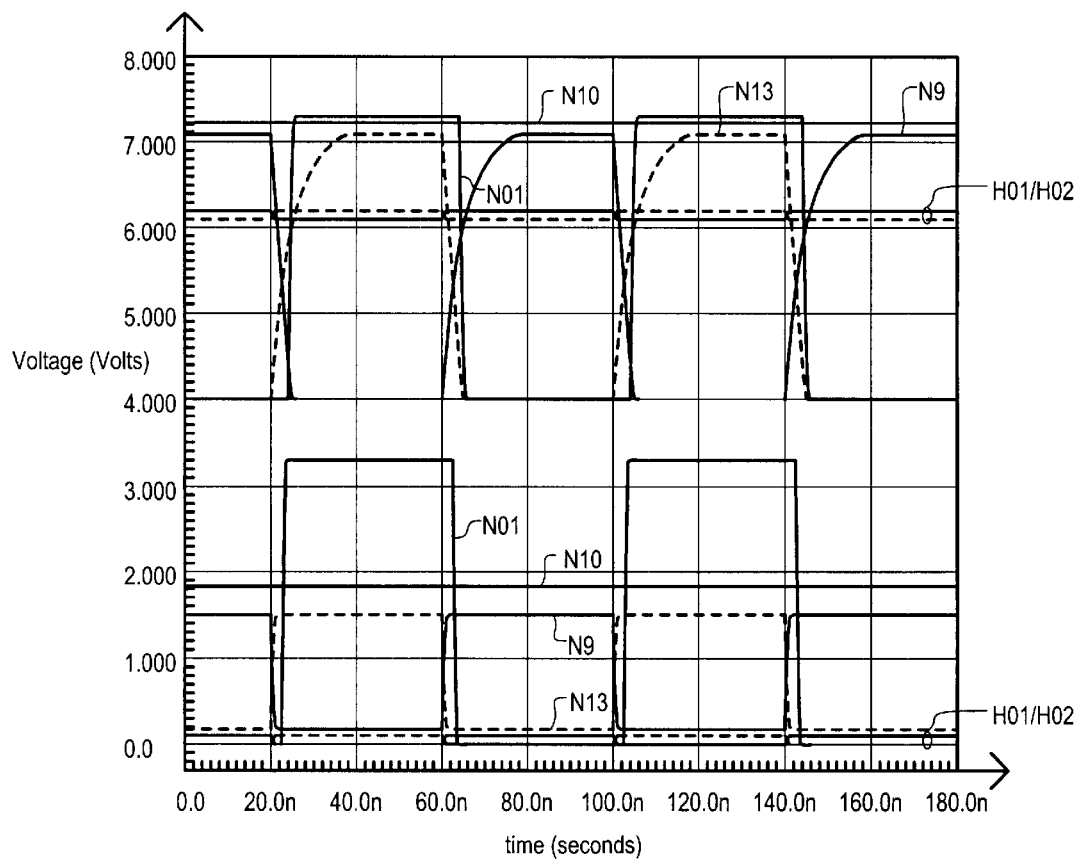
FIG. 13 is a waveform diagram illustrating the operation of a conventional input buffer.

In the conventional approach as illustrated in FIGS. 14 and 12, a delay difference is 2.456 ns, where a difference in delay of initial stage circuits (SN1 and SP1) is about 1.684 ns and a difference in delay in the next stage differential amplifying circuit SOP is about 0.772 ns.

In the conventional approach as illustrated in FIG. 16 incorporated into FIG. 12, a delay difference is 1.333 ns, where a difference in delay of initial stage circuits (SN1 and SP1) is 0.478 ns and a difference in delay in the next stage differential amplifying circuit SOP is about 0.855 ns.

In the embodiment as illustrated in FIGS. 1 and 2, a delay difference is about 0.683 ns, where a difference in delay of initial stage circuits (SN1 and SP1) is about 0.450 ns and a difference in delay in the next stage differential amplifying circuit SOP is about 0.233 ns.

Figure 6:
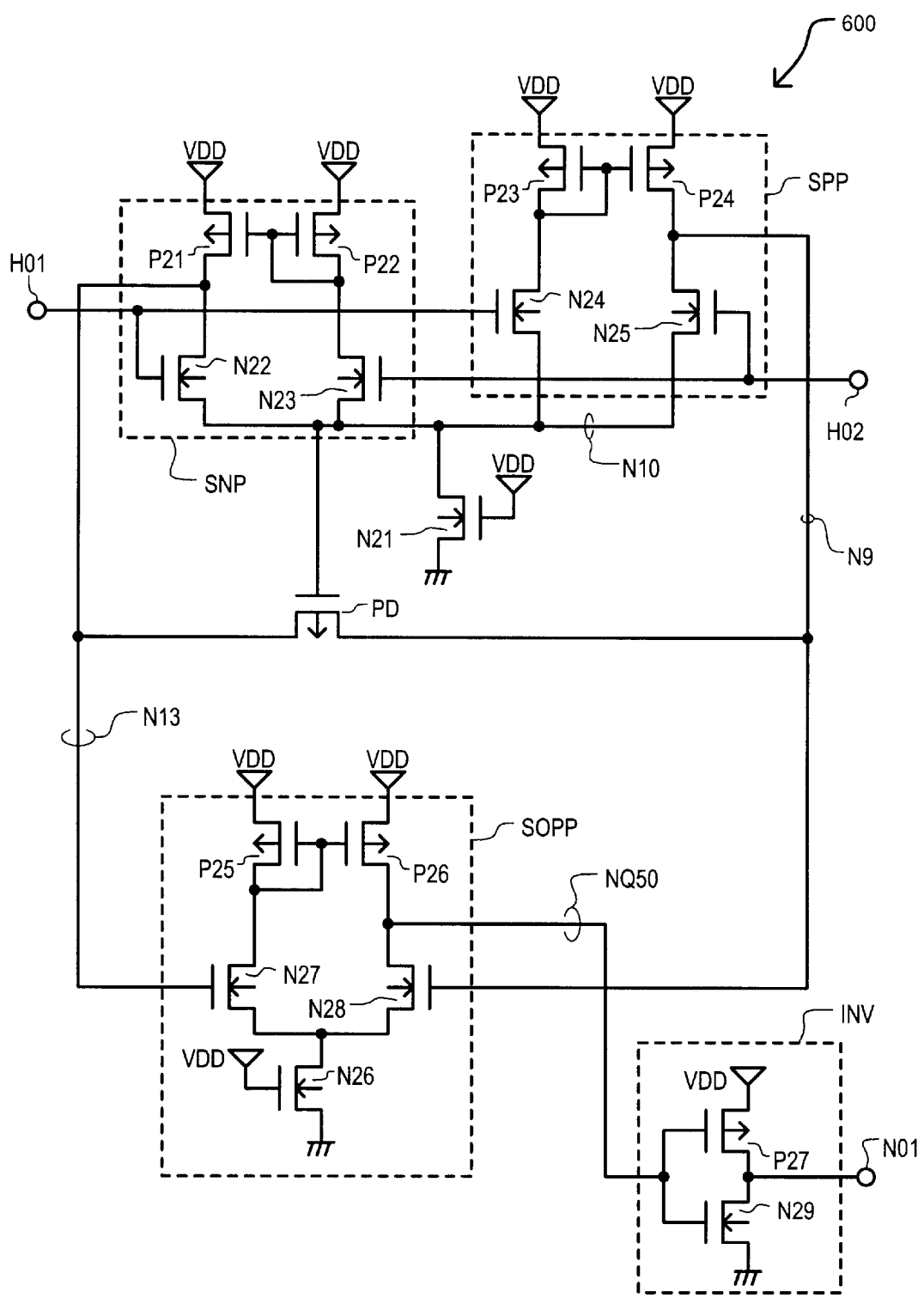
FIG. 6 is a circuit schematic diagram of a multi-stage differential amplifying circuit according to a second embodiment.

A second embodiment will now be discussed with reference to FIG. 6. FIG. 6 is a circuit schematic diagram of a multi-stage differential amplifying circuit according to a second embodiment and given the general reference character 600.

Multi-stage differential amplifying circuit 600 may receive an input signal at input terminals (H01 and H02) and may provide an output at an output terminal N01. A logic level at output terminal N01 may be based on a polarity of a potential difference of an input signal at input terminals (H01 and H02).

Multi-stage differential amplifying circuit 600 may include a transistor N21, initial stage differential amplifying circuits (SNP and SPP), a next stage differential amplifying circuit SOPP, an inverter INV, and an amplitude controlling transistor PD.

Transistor N21 may have a source connected to ground, a drain connected to node N10, and a gate connected to a power supply (VDD). Transistor N21 may serve as a current source. Transistor N21 may be a n-channel IGFET (insulated gate field effect transistor). Node N10 may be considered a current supplying/sinking terminal.

Initial stage differential amplifying circuit SNP may include transistors (N22, N23, P21 and P22). Transistor P21 may have a source connected to a power supply VDD, a drain connected to a drain of transistor N22 at node N13, and a gate connected to a gate of transistor P22 and a common drain connection of transistors (P22 and N23). Transistor P22 may have a source connected to VDD, a gate and drain commonly connected to a gate of transistor P21 and a drain of transistor N23. Transistor N22 may have a source connected to node N10, a drain connected to a drain of transistor P21 at node N13, and a gate connected to receive an input signal at input terminal H01. Transistor N23 may have a source connected to node N10, a drain connected to a drain of transistor P22 and a common gate connection of transistors (P21 and P22), and a gate connected to receive an input signal at input terminal H02. Transistors (N22 and N23) may be n-channel IGFETs and transistors (P21 and P22) may be p-channel IGFETs.

Initial stage differential amplifying circuit SPP may include transistors (P23, P24, N24 and N25). Transistor P24 may have a source connected to VDD, a drain connected to a drain of transistor N25 at node N9, and a gate connected to a gate of transistor P23 and a common drain connection of transistors (N24 and P23). Transistor P23 may have a source connected to VDD, a gate and drain commonly connected to a gate of transistor P24 and a drain of transistor N24. Transistor N25 may have a source connected to node N10, a drain connected to a drain of transistor P24 at node N9, and a gate connected to receive an input signal at input terminal H02. Transistor N24 may have a source connected to node N10, a drain connected to a drain of transistor P23 and a common gate connection of transistors (P23 and P24), and a gate connected to receive an input signal at input terminal H01. Transistors (N24 and N25) may be n-channel IGFETs and transistors (P23 and P24) may be p-channel IGFETs.

Next stage differential amplifying circuit SOPP may include transistors (N26, N27, N28, P25 and P26). Transistor P26 may have a source connected to VDD, a drain connected to a drain of transistor N28 at node NQ50, and a gate connected to a gate of transistor P25 and a common drain connection of transistors (P25 and N27). Transistor P25 may have a source connected to VDD, a gate and drain commonly connected to a gate of transistor P26 and a drain of transistor N27. Transistor N28 may have a source connected to a drain of transistor N26, a drain connected to a drain of transistor P26 at node NQ50, and a gate connected to node N9. Transistor N27 may have a source connected to a drain of transistor N26, a drain connected to a drain of transistor P25 and a common gate connection of transistors (P25 and P26), and a gate connected to node N13. Transistor N26 may have a source connected to ground, a drain connected to a common source connection of transistors (N27 and N28), and a gate connected to VDD. Transistors (P25 and P26) may be p-channel IGFETs and transistors (N26, N27 and N28) may be n-channel IGFETs.

Inverter INV may include transistors (N29 and P27). Transistor N29 may have a source connected to ground a drain connected to output terminal N01, and a gate connected to node NQ50. Transistor P27 may have a source connected to a power supply (VDD) a drain connected to output terminal N01, and a gate connected to node NQ50. Transistor N29 may be an n-channel IGFET and transistor P27 may be a p-channel IGFET.

Amplitude controlling transistor PD may have a first source/drain connected to node N9, a second source/drain connected to node N13, and a gate connected to node N10. Amplitude controlling transistor PD may be a p-channel IGFET.

Multi-stage differential amplifying circuit 600 may differ from multi-stage differential amplifying circuit 100 in that transistor types may be switched. In other words, n-channel transistors may be replaced with p-channel transistors and p-channel transistors may be replaced with n-channel transistors. For example, amplitude controlling transistor PD may be a p-channel IGFET, but amplitude controlling transistor ND in FIG. 1 may be a n-channel IGFET.

In multi-stage differential amplifying circuit 600, when an offset voltage of a small signal input at nodes (H01 and H02) is lower, transistors (N22, N23, N24, and N25) may be more resistive. Thus, the potential at node N10 may be lower and amplitude controlling transistor PD may have a lower impedance. However, when an offset voltage of a small signal input at nodes (H01 and H02) is higher, transistors (N22, N23, N24, and N25) may be less resistive. Thus, the potential at node N10 may be higher and amplitude controlling transistor PD may have a higher impedance.

In the embodiment of FIG. 6, an impedance of an amplitude controlling transistor PD may be controlled so that a difference in an amplitude of an output signal from initial stage amplifying circuits (SNP and SPP) may have a reduced range (variation) when an offset voltage of an input signal varies. An impedance of an amplitude controlling transistor PD may be controlled and may have a higher impedance when an input signal has a higher offset voltage and may have a lower impedance when an input signal has a lower offset voltage.

Figure 7:
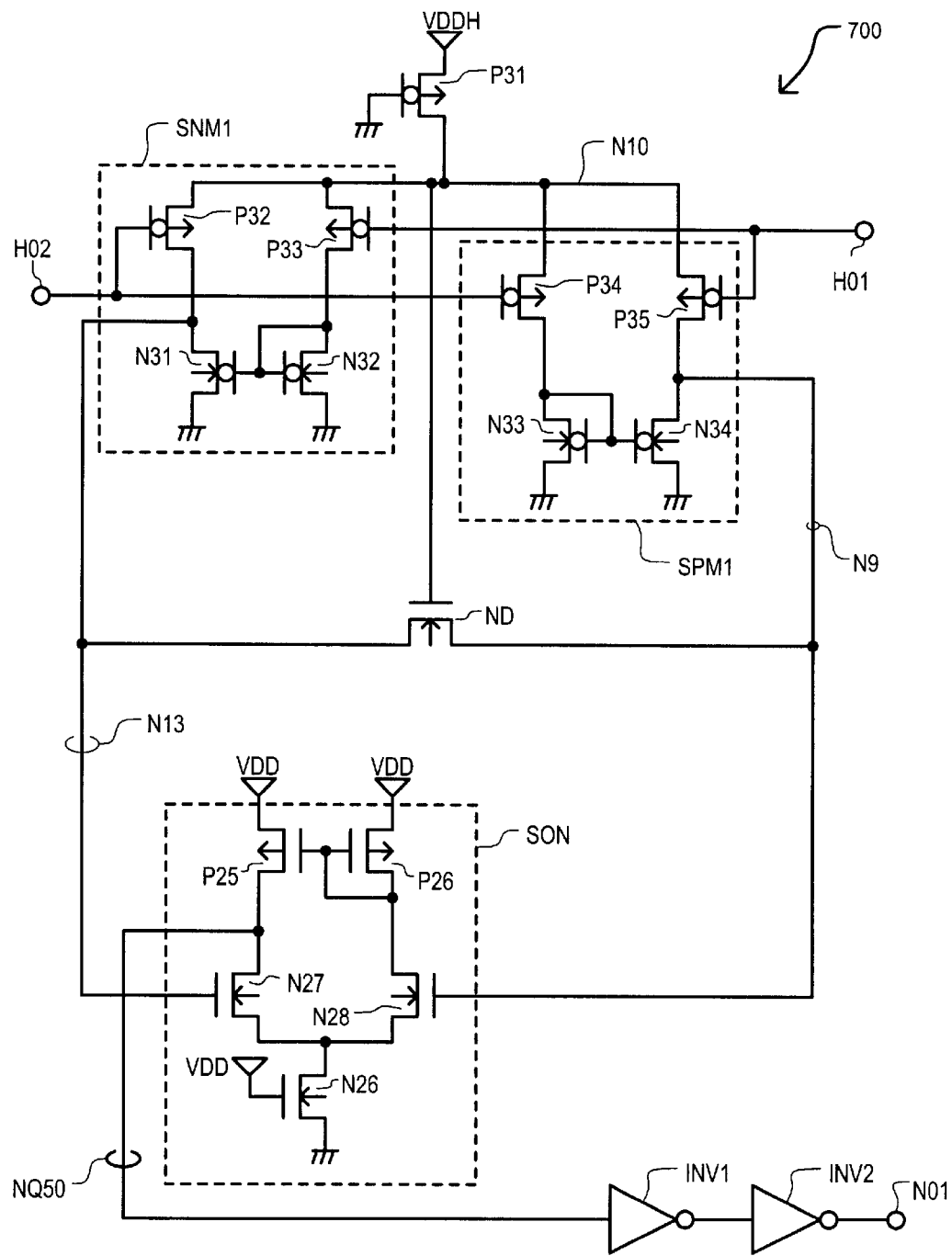
FIG. 7 is a circuit schematic diagram of a multi-stage differential amplifying circuit according to a third embodiment.

A third embodiment will now be discussed with reference to FIG. 7. FIG. 7 is a circuit schematic diagram of a multi-stage differential amplifying circuit according to a third embodiment and given the general reference character 700. Multi-stage differential amplifying circuit 700 may include similar constituents as the above-mentioned embodiments and such constituents may be referred to by the same reference character.

Multi-stage differential amplifying circuit 700 may receive an input signal at input terminals (H01 and H02) and may provide an output at an output terminal N01. A logic level at output terminal N01 may be based on a polarity of a potential difference of an input signal at input terminals (H01 and H02).

Multi-stage differential amplifying circuit 700 may include a transistor P31, initial stage differential amplifying circuits (SNM1 and SPM1), a next stage differential amplifying circuit SON, inverters (INV1 and INV2), and an amplitude controlling transistor ND.

Multi-stage differential amplifying circuit 700 may differ from multi-stage differential amplifying circuit 100 in that initial stage amplifying circuits (SNM1 and SPM1) may include high voltage transistors having a thicker gate oxide and/or longer gate lengths in order to withstand higher voltages. Also, transistor P31 may be a high voltage transistor and may have a source connected to a high voltage power supply VDDH.

This may be done in order to allow proper operation when an input signal at nodes (H01 and H02) has a higher voltage offset.

High voltage transistor P31 may have a source connected to a high power supply VDDH, a drain connected to node N10, and a gate connected to ground (VSS). High voltage transistor P31 may serve as a current source. High voltage transistor P31 may be a p-channel IGFET (insulated gate field effect transistor). Node N10 may be considered a current supplying terminal.

Initial stage differential amplifying circuit SNM1 may include high voltage transistors (P32, P33, N31 and N32). High voltage transistor N31 may have a source connected to ground, a drain connected to a drain of high voltage transistor P32 at node N13, and a gate connected to a gate of high voltage transistor N32 and a common drain connection of high voltage transistors (N32 and P33). High voltage transistor N32 may have a source connected to ground, a gate and drain commonly connected to a gate of high voltage transistor N31 and a drain of high voltage transistor P33. High voltage transistor P32 may have a source connected to node N10, a drain connected to a drain of high voltage transistor N31 at node N13, and a gate connected to receive an input signal at input terminal H02. High voltage transistor P33 may have a source connected to node N10, a drain connected to a drain of high voltage transistor N32 and a common gate connection of high voltage transistors (N31 and N32), and a gate connected to receive an input signal at input terminal H01. High voltage transistors (N31 and N32) may be n-channel IGFETs and high voltage transistors (P32 and P33) may be p-channel IGFETs.

Initial stage differential amplifying circuit SPM1 may include high voltage transistors (P34, P35, N33 and N34). High voltage transistor N34 may have a source connected to ground, a drain connected to a drain of high voltage transistor P35 at node N9, and a gate connected to a gate of high voltage transistor N33 and a common drain connection of high voltage transistors (N33 and P34). High voltage transistor N33 may have a source connected to ground, a gate and drain commonly connected to a gate of high voltage transistor N34 and a drain of high voltage transistor P34. High voltage transistor P35 may have a source connected to node N10, a drain connected to a drain of high voltage transistor N34 at node N9, and a gate connected to receive an input signal at input terminal H01. High voltage transistor P34 may have a source connected to node N10, a drain connected to a drain of high voltage transistor N33 and a common gate connection of high voltage transistors (N33 and N34), and a gate connected to receive an input signal at input terminal H02. High voltage transistors (N33 and N34) may be n-channel IGFETs and high voltage transistors (P34 and P35) may be p-channel IGFETs.

Next stage differential amplifying circuit SON may include transistors (N26, N27, N28, P25 and P26). Transistor P25 may have a source connected to VDD, a drain connected to a drain of transistor N27 at node NQ50, and a gate connected to a gate of transistor P26 and a common source connection of transistors (P26 and N28). Transistor P26 may have a source connected to VDD, a gate and drain commonly connected to a gate of transistor P25 and a drain of transistor N28. Transistor N27 may have a source connected to a drain of transistor N26, a drain connected to a drain of transistor P25 at node NQ50, and a gate connected to node N13. Transistor N28 may have a source connected to a drain of transistor N26, a drain connected to a drain of transistor P26 and a common gate connection of transistors (P25 and P26), and a gate connected to node N9. Transistor N26 may have a source connected to ground, a drain connected to a common source connection of transistors (N27 and N28), and a gate connected to VDD. Transistors (P25 and P26) may be p-channel IGFETs and transistors (N26, N27 and N28) may be n-channel IGFETs.

Inverter INV1 may have an input connected to node NQ50 and an output connected to an input of inverter INV2. Inverter INV2 may have an output connected to output terminal N01.

Amplitude controlling transistor ND may have a first source/drain connected to node N9, a second source/drain connected to node N13, and a gate connected to node N10. Amplitude controlling transistor ND may be an n-channel IGFET.

By using high voltage transistors in initial stage differential amplifying circuits (SNM1 and SPM1), an input signal provided at input terminals (H01 and H02) may have a higher offset. High voltage transistor P31 may be connected to a high voltage power supply VDDH that may be higher than a power supply VDD. In this way, initial stage differential amplifying circuits (SNM1 and SPM1) may function correctly when receiving an input voltage that may have a greater range.

Next stage differential amplifying circuit SON may be connected to power supply VDD. However, by including amplitude controlling transistor ND in multi-stage differential amplifying circuit 700, a signal at nodes (N9 and N13) may have a low enough amplitude so that differential amplifying circuit SON may properly operate.

In the conventional approach (FIG. 12), if transistor P1 is connected to receive a high voltage power supply VDDH and next stage amplifying circuit SOP is connected to receive power supply VDD, the output potential at nodes (N9 and N13) may have a wide voltage range so that next stage amplifying circuit SOP may not properly function.

In order to save power and improve miniaturization of device sizes, it may be desirable to operate an integrated circuit at as low a voltage as possible. As an example, let us consider a case where an input voltage at input terminals (H01 and H02) has a range of 0 V to 2.4 V, a maximum Vt of transistors is 0.7 V, and a power supply VDD is 3.3 V. In this case, if transistor P1 is connected to VDD, initial stage differential amplifying circuits (SN1 and SP1) may not properly function. Thus, multi-stage differential amplifying circuit 700 may include a high voltage transistor P31 connected to a high voltage power supply VDDH. In this case, VDDH may be 5.0 V, as just one example. Thus, high voltage transistors (P32 to P35) may achieve a gate to source voltage (Vgs) that may assure proper operation. However, next stage amplifying circuit SON may be connected to receive power supply VDD (3.3 V). By including amplitude controlling transistor ND, an output signal at nodes (N9 and N13) may have an amplitude reduced to a range that may allow proper operation of next stage differential amplifying circuit SON. In this way, an input signal may have a relatively high voltage range and internal circuitry may still receive a low operating voltage.

In the embodiment of FIG. 7, an impedance of an amplitude controlling transistor ND may be controlled so that a difference in an amplitude of an output signal from initial stage amplifying circuits (SNM1 and SPM1) may have a reduced range (variation) when an offset Voltage of an input signal varies. An impedance of an amplitude controlling transistor ND may be controlled and may have a lower impedance when an input signal has a higher offset voltage and may have a higher impedance when an input signal has a lower offset voltage.

Additionally, because the amplitude of the output signal from initial stage amplifying circuits (SNM1 and SPM1) may influence a propagation delay of a next stage differential amplifying circuit SON, by providing a more consistent amplitude when an offset voltage of an input signal varies, a propagation delay of a next stage differential amplifying circuit SOP may be more consistent.

Additionally, with an amplitude of an output signal from initial stage amplifying circuits (SNM1 and SPM1) having a reduced potential, initial stage amplifying circuits (SNM1 and SNP1) may receive an input signal having a higher potential while providing an output signal to next stage differential amplifying circuit SON having a lower potential. In this way, next stage differential amplifying circuit SON and subsequent circuits may operate using a lower power supply voltage and high speed operation may be ensured.

Figure 8:
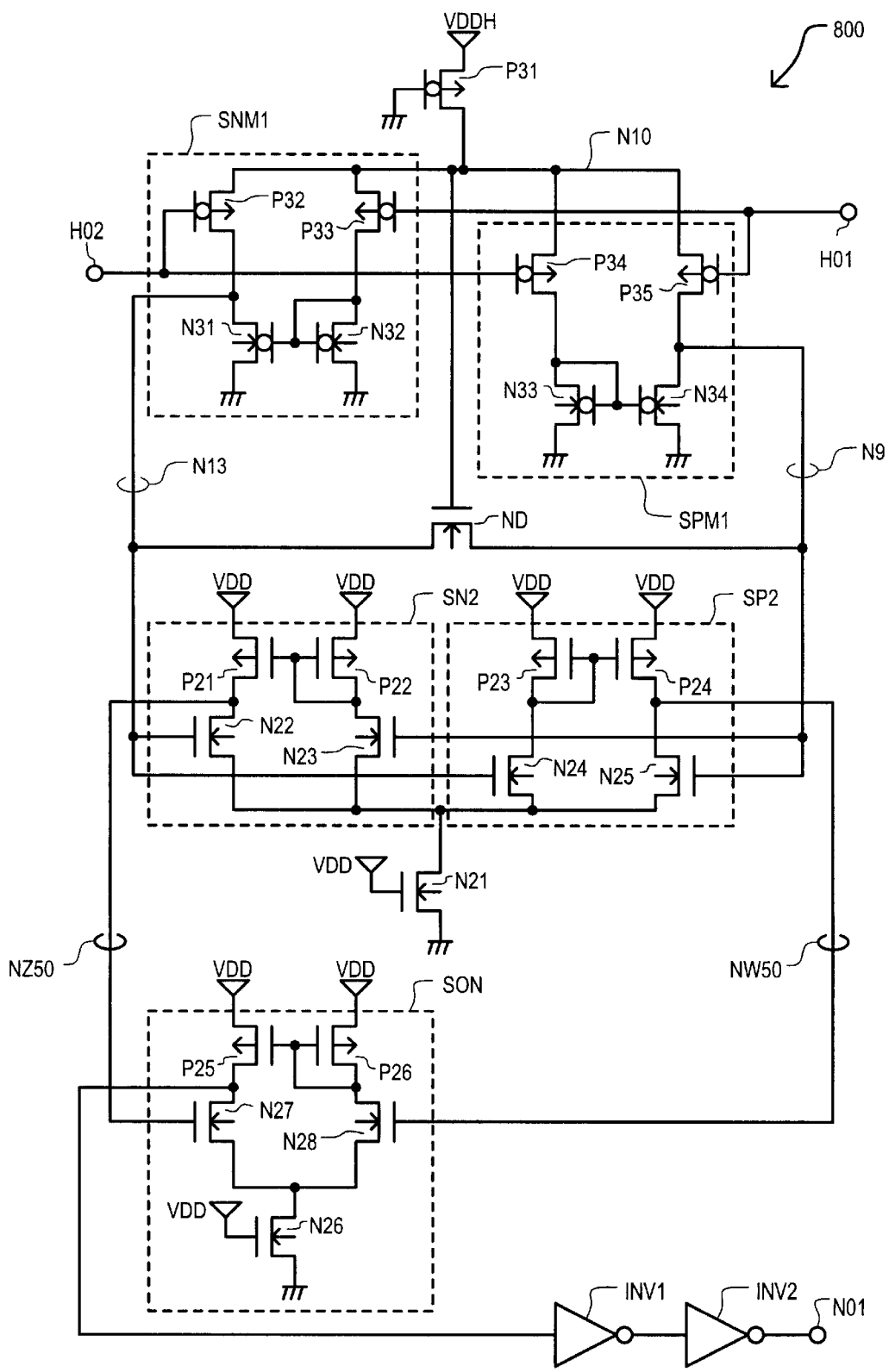
FIG. 8 is a circuit schematic diagram of a multi-stage differential amplifying circuit according to a fourth embodiment.
Figure 9:
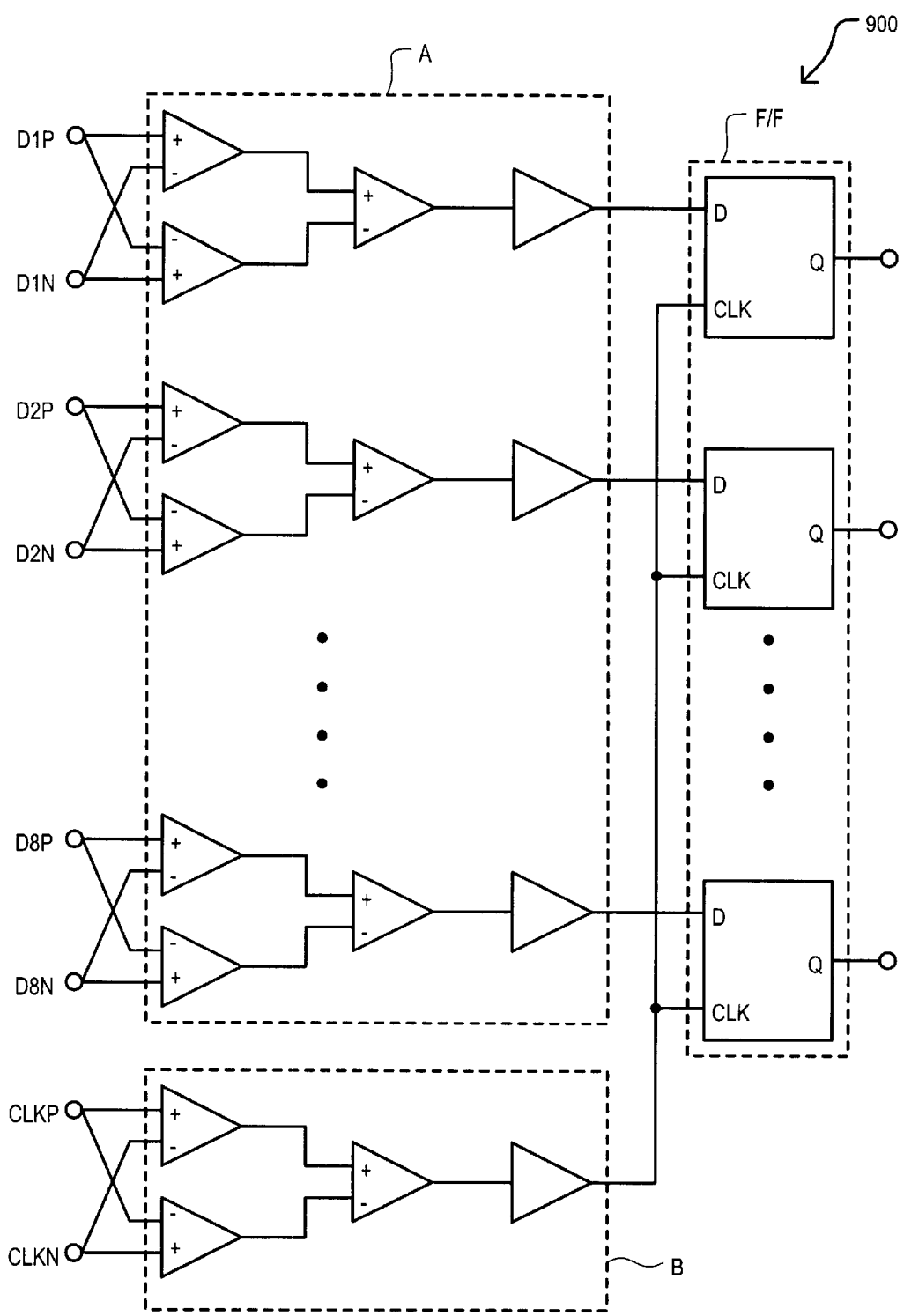
FIG. 9 is a circuit schematic diagram of a conventional data receiver.
Figure 10:
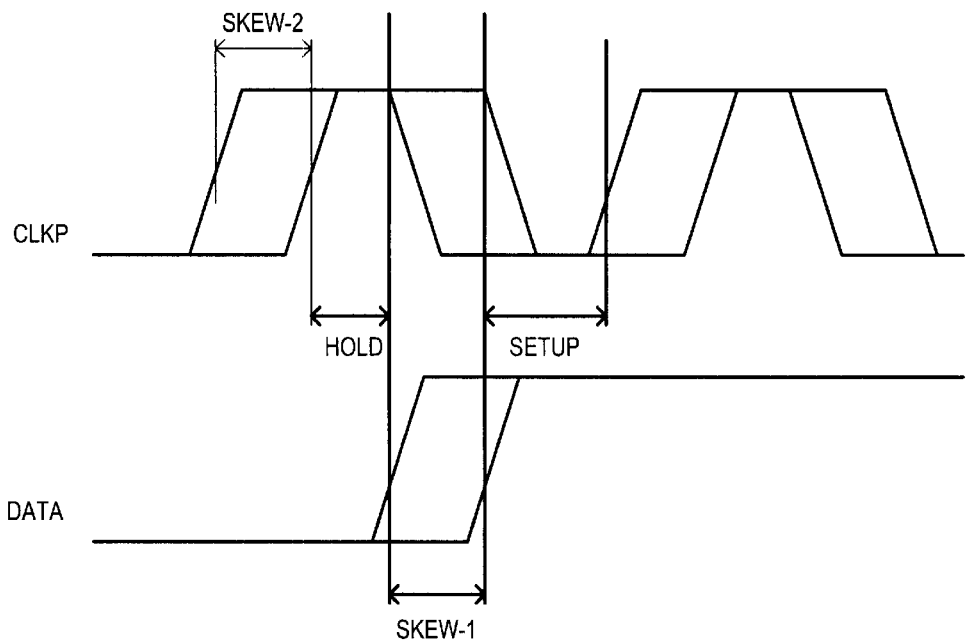
FIG. 10 is a timing diagram illustrating skews of input signals in a conventional data receiver.
Figure 11:
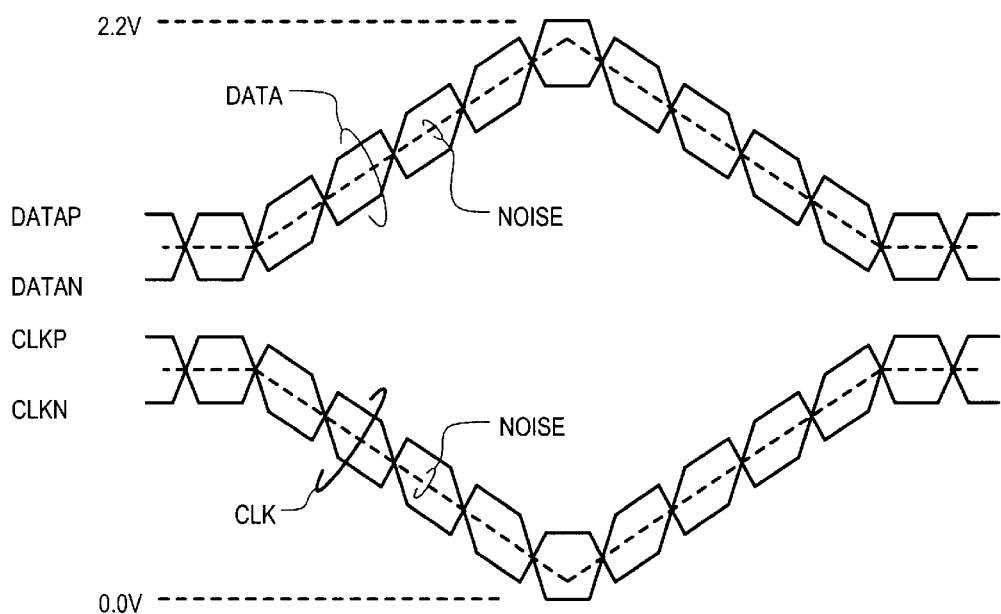
FIG. 11 is a waveform diagram illustrating an example of a clock signal and a data signal.

A fourth embodiment will now be discussed with reference to FIG. 8. FIG. 8 is a circuit schematic diagram of a multi-stage differential amplifying circuit according to a fourth embodiment and given the general reference character 800. Multi-stage differential amplifying circuit 800 may include similar constituents as multi-stage differential amplifying circuit 700. Such similar constituents may be referred to by the same reference character and a description may be omitted.

Multi-stage differential amplifying circuit 800 may receive an input signal at input terminals (H01 and H02) and may provide an output at an output terminal N01. A logic level at output terminal N01 may be based on a polarity of a potential difference of an input signal at input terminals (H01 and H02).

Multi-stage differential amplifying circuit 800 may include a high voltage transistor P31, initial stage differential amplifying circuits (SNM1 and SPM1), next stage differential amplifying circuits (SN2 and SP2), final stage differential amplifying circuit SON, inverters (INV1 and INV2), and an amplitude controlling transistor ND.

Multi-stage differential amplifying circuit 800 may differ from multi-stage differential amplifying circuit 700 in that next stage differential amplifying circuits (SN2 and SP2) may be connected in parallel to receive differential signals at nodes (N9 and N13) and provide differential signals at nodes (NW50 and NZ50) as inputs to final stage differential amplifying circuit SON.

Next stage differential amplifying circuit SN2 may include transistors (N22, N23, P21 and P22). Transistor P21 may have a source connected to VDD, a drain connected to a drain of transistor N22 at node NZ50, and a gate connected to a gate of transistor P22 and a common drain connection of transistors (P22 and N23). Transistor P22 may have a source connected to VDD, a gate and drain commonly connected to a gate of transistor P21 and a drain of transistor N23. Transistor N22 may have a source connected to a drain of transistor N21, a drain connected to a drain of transistor P21 at node NZ50, and a gate connected to node N13. Transistor N23 may have a source connected to a drain of transistor N21, a drain connected to a drain of transistor P22 and a common gate connection of transistors (P22 and P21), and a gate connected to node N9. Transistors (P21 and P22) may be p-channel IGFETs and transistors (N22 and N23) may be n-channel IGFETs.

Next stage differential amplifying circuit SP2 may include transistors (N24, N25, P23 and P24). Transistor P24 may have a source connected to VDD, a drain connected to a drain of transistor N25 at node NW50, and a gate connected to a gate of transistor P23 and a common drain connection of transistors (P23 and N24). Transistor P23 may have a source connected to VDD, a gate and drain commonly connected to a gate of transistor P24 and a drain of transistor N24. Transistor N25 may have a source connected to a drain of transistor N21, a drain connected to a drain of transistor P24 at node NW50, and a gate connected to node N9. Transistor N24 may have a source connected to a drain of transistor N21, a drain connected to a drain of transistor P23 and a common gate connection of transistors (P23 and P24), and a gate connected to node N13. Transistors (P23 and P24) may be p-channel IGFETs and transistors (N24 and N25) may be n-channel IGFETs.

Transistor N21 may have a source connected to ground, a drain connected to a common source connection of transistors (N22, N23, N24, and N25), and a gate connected to VDD.

Final stage differential amplifying circuit SON may include transistors (N26, N27, N28, P25 and P26). Transistor P25 may have a source connected to VDD, a drain connected to a drain of transistor N27, and a gate connected to a gate of transistor P26 and a common drain connection of transistors (P26 and N28). Transistor P26 may have a source connected to VDD, a gate and drain commonly connected to a gate of transistor P25 and a drain of transistor N28. Transistor N27 may have a source connected to a drain of transistor N26, a drain connected to a drain of transistor P25 at node NQ50, and a gate connected to node NZ50. Transistor N28 may have a source connected to a drain of transistor N26, a drain connected to a drain of transistor P26, and a common gate connection of transistors (P25 and P26), and a gate connected to node NW50. Transistor N26 may have a source connected to ground, a drain connected to a common source connection of transistors (N27 and N28), and a gate connected to VDD. Transistors (P25 and P26) may be p-channel IGFETs and transistors (N26, N27 and N28) may be n-channel IGFETs.

High voltage transistor P31 may have a source connected to receive a high power supply VDDH, a gate connected to ground, and a source connected sources of high voltage transistors (P32, P33, P34, and P35) in initial stage differential amplifying circuits (SNM1 and SNP1).

High voltage transistor P31 may provide a current source for initial stage differential amplifying circuits (SNM1 and SPM1). Transistor N21 may provide a current source for next stage differential amplifying circuits (SN2 and SP2).

By using high voltage transistors in initial stage differential amplifying circuits (SNM1 and SPM1), an input signal provided at input terminals (H01 and H02) may have a higher offset. High voltage transistor P31 may be connected to a high voltage power supply VDDH that may be higher than a power supply VDD. In this way, initial stage differential amplifying circuits (SNM1 and SPM1) may function correctly when receiving an input voltage that may have a greater range.

Next stage differential amplifying circuits (SN2 and SP2) may be connected to power supply VDD. However, by including amplitude controlling transistor ND in multi-stage differential amplifying circuit 800, a signal at nodes (N9 and N13) may have a low enough amplitude so that differential amplifying circuits (SN2 and SP2) may properly operate.

In the embodiment of FIG. 8, an impedance of an amplitude controlling transistor ND may be controlled so that a difference in an amplitude of an output signal from initial stage amplifying circuits (SNM1 and SPM1) may have a reduced range (variation) when an offset voltage of an input signal varies. An impedance of an amplitude controlling transistor ND may be controlled and may have a lower impedance when an input signal has a higher offset voltage and may have a higher impedance when an input signal has a lower offset voltage.

Additionally, because the amplitude of the output signal from initial stage amplifying circuits (SNM1 and SPM1) may influence a propagation delay of a next stage differential amplifying circuits (SN2 and SP2), by providing a more consistent amplitude when an offset voltage of an input signal varies, a propagation delay of a next stage differential amplifying circuits (SN2 and SP2) may be more consistent.

Additionally, with an amplitude of an output signal from initial stage amplifying circuits (SNM1 and SPM1) having a reduced potential, initial stage amplifying circuits (SNM1 and SNP1) may receive an input signal having a higher potential while providing an output signal to next stage differential amplifying circuits (SN2 and SP2) having a lower potential. In this way, next stage differential amplifying circuits (SN2 and SP2) and subsequent circuits such as final stage amplifying circuit SON may operate using a lower power supply voltage and high speed operation may be ensured.

Multi-stage differential .amplifying circuit 800 may have three stages of amplification. A first stage of amplification may be provided by initial stage differential amplifying circuits (SNM1 and SPM1). A second stage of amplification may be provided by next stage differential amplifying circuits (SN2 and SP2). A third stage of amplification may be provided by final stage differential amplifying circuit SON.

In the above-mentioned embodiments, a multi-stage differential amplifying circuit may include an amplitude controlling transistor having a conductivity type that may be opposite to the conductivity type of input transistors of that receive input signals at an input terminal (H01 and H02). Amplitude controlling transistor may provide a controllable impedance path connected between a forward output terminal and a reverse output terminal. A control gate of an amplitude controlling transistor may be connected to a current supplying terminal. The current supplying terminal may be a constant current supplying terminal. Thus, an increase in amplitude of an output signal may be suppressed, so that an amplitude of an output signal may have a reduced variation over variations of an offset voltage of an input signal. In this way, high speed operations may be improved.

It is understood that the embodiments described above are exemplary and the present invention should not be limited to those embodiments. Specific structures should not be limited to the described embodiments.

Thus, while the various particular embodiments set forth herein have been described in detail, the present invention could be subject to various changes, substitutions, and alterations without departing from the spirit and scope of the invention. Accordingly, the present invention is intended to be limited only as defined by the appended claims.

What is claimed is:

1. A differential amplifying circuit, comprising:
   first and second input terminals coupled to receive an input signal;
   a current source coupled between a power supply and a current supplying terminal;
   an amplitude controlling transistor providing a controllable impedance path between a forward and a reverse output terminal of a differential amplifying stage and having a gate coupled to the current supplying terminal.

2. The differential amplifying circuit according to claim 1, further including:
   a first input transistor having a gate coupled to the first input terminal;
   a second input transistor having a gate coupled to the second input terminal wherein
      the first and second input transistors are insulated gate field effect transistors (IGFETs) having a first conductivity type and the amplitude controlling transistor is an IGFET having a second conductivity type.

3. The differential amplifying circuit according to claim 2, wherein:
   the first conductivity type is a p-type and the second conductivity type is an n-type.

4. The differential amplifying circuit according to claim 2, wherein:
   the first conductivity type is an n-type and the second conductivity type is a p-type.

5. The differential amplifying circuit according to claim 2, wherein:
   the forward and reverse output signals are provided as an input to a next stage circuit including at least one transistor having a first gate oxide thickness; and
   the first and second input transistors have a second gate oxide thickness that is thicker than the first gate oxide thickness.

6. The differential amplifying circuit according to claim 1, wherein:
   the differential amplifying circuit is included in an input buffer circuit on an integrated circuit.

7. A multi-stage differential amplifying circuit, comprising:
   a first differential amplifying circuit coupled to receive an input signal at first and second input terminals and provides a differential output signal at a forward and a reverse output terminal, the first differential amplifying circuit includes a first input transistor having a gate coupled to the first input terminal and a second input transistor having a gate coupled to the second input terminal;
   a current source coupled between a first power supply and a current supply node and the current supply node provides current to the first and second input transistors;
   an amplitude controlling transistor having a gate coupled to the current supply node and providing a controllable impedance path between the forward and a reverse output terminals; and a second differential amplifying circuit coupled to receive the differential output signal and provide a multi-stage output signal.

8. The multi-stage differential amplifying circuit according to claim 7, wherein:

the first and second input transistors are insulated gate field effect transistors (IGFETs) having a first conductivity type and the amplitude controlling transistor is an IGFET having a second conductivity type.

9. The multi-stage differential amplifying circuit according to claim 8, further including:

the first conductivity type is a p-type and the second conductivity type is an n-type.

10. The multi-stage differential amplifying circuit according to claim 8, wherein:

the first conductivity type is an n-type and the second conductivity type is a p-type.

11. The multi-stage differential amplifying circuit according to claim 8, wherein:

the second differential amplifying circuit includes at least one IGFET having a first gate oxide thickness;

the first and second input transistors have a second gate oxide thickness that is thicker than the first gate oxide thickness.

12. The multi-stage differential amplifying circuit according to claim 7, wherein:

the second differential amplifying circuit is coupled to operate from a second power supply; and the second power supply has a lower potential than the first power supply.

13. The multi-stage differential amplifying circuit according to claim 7, wherein:

the multi-stage differential amplifying circuit is included in an input buffer circuit on an integrated circuit.

14. A differential amplifying circuit, comprising:

first and second input terminals, a first differential amplifying circuit coupled to receive a differential input signal from the first and second input terminals and provide a differential output signal at a forward and a reverse output terminal; and an amplitude controlling insulated gate field effect transistor (IGFET) providing a controllable impedance path between the forward and reverse output terminals wherein a potential at a control gate of the amplitude controlling IGFET varies as an offset voltage of the differential input signal varies.

15. The differential amplifying circuit according to claim 14, wherein:

an impedance of the controllable impedance path is lower when the offset voltage is a first potential than when the offset voltage is a second potential.

16. The differential amplifying circuit according to claim 15, wherein:

the first potential is higher than the second potential.

17. The differential amplifying circuit according to claim 14, wherein:

the first differential amplifying circuit includes a first input IGFET having a first control gate coupled to the first input terminal and a second input IGFET having a second control gate coupled to the second input terminal; and the first and second IGFETs have a p-type conductivity and the amplitude controlling IGFET has an n-type conductivity.

18. The differential amplifying circuit according to claim 14, wherein:

the first differential amplifying circuit includes a first input IGFET having a first control gate coupled to the first input terminal and a second input IGFET having a second control gate coupled to the second input terminal; and the first and second IGFETs have a n-type conductivity and the amplitude controlling IGFET has a p-type conductivity.

19. The differential amplifying circuit according to claim 14, further including:

a second differential amplifying circuit coupled to receive the differential output signal and provide a multi-stage output signal.

20. The differential amplifying circuit according to claim 19, wherein:

the first differential amplifying circuit is coupled to operate from a first power supply and the second differential amplifying circuit is coupled to operate from a second power supply and the first power supply has a higher potential than the second power supply.

* * * * *